(12) United States Patent
Kim et al.

(10) Patent No.: US 7,200,792 B2
(45) Date of Patent: Apr. 3, 2007

(54) INTERLEAVING APPARATUS AND METHOD FOR SYMBOL MAPPING IN AN HSDPA MOBILE COMMUNICATION SYSTEM

(75) Inventors: Hun-Kee Kim, Seoul (KR); Gin-Kyu Choi, Seoul (KR); Jae-Seung Yoon, Songnam-shi (KR); Noh-Sun Kim, Suwon-shi (KR); Jun-Sung Lee, Suwon-shi (KR); Yong-Suk Moon, Songnam-shi (KR)

(73) Assignee: Samsung Electronics Co., Ltd. (KR)

( * ) Notice: Subject to any disclaimer, the term of this patent is extended or adjusted under 35 U.S.C. 154(b) by 583 days.

(21) Appl. No.: 10/324,215

(22) Filed: Dec. 20, 2002

(65) Prior Publication Data

US 2003/0120995 A1 Jun. 26, 2003

(30) Foreign Application Priority Data

Dec. 21, 2001 (KR) ............... 10-2001-0083064

(51) Int. Cl.
*H03M 13/00* (2006.01)
*H03M 13/03* (2006.01)

(52) U.S. Cl. ............ 714/755; 714/786; 714/758; 714/790

(58) Field of Classification Search ............. None
See application file for complete search history.

(56) References Cited

U.S. PATENT DOCUMENTS 5,689,439 A * 11/1997 Weerackody et al. ....... 370/329
6,351,832 B1 * 2/2002 Wei ........................... 714/701
6,560,748 B2 * 5/2003 Li .............................. 714/786
6,631,491 B1 * 10/2003 Shibutani et al. ........... 714/762
7,028,230 B2 * 4/2006 Manninen et al. .......... 714/702
2002/0159501 A1 * 10/2002 Agami et al. ............... 375/130
2003/0079170 A1 * 4/2003 Stewart et al. .............. 714/755

FOREIGN PATENT DOCUMENTS

EP     1 248 404       10/2002
JP     2001-332980     11/2001

OTHER PUBLICATIONS

European Search Report dated Apr. 29, 2003, issued in a counterpart application, namely, Appln. No. 02028629.0.

(Continued)

*Primary Examiner*—Phung My Chung
(74) *Attorney, Agent, or Firm*—The Farrell Law Firm

(57) ABSTRACT

In an apparatus for data transmission in a communication system, a turbo encoder encodes data bits to generate systematic bits and parity bits, and a rate matcher matches the systematic bits and parity bits. A first interleaver writes the rate-matched systematic bits on a row by row basis, and performs inter-column permutation. A second interleaver writes the rate-matched parity bits on a row-by-row basis, and performs inter-column permutation. A modulator alternatively collects the permutated bits on a column by column basis from the first and second interleavers, and maps collected bits from the first and second interleavers onto one modulation symbol, wherein a size of the first interleaver is equal to a size of the second interleaver.

16 Claims, 27 Drawing Sheets

OTHER PUBLICATIONS

Samsung Electronics: "Enhanced Symbol Mapping Method for the Modulation of Turbo-coded Bits based on Bit Priority," 3GPP TSG RAN WG1/WG2 Joint Meeting on HSDPA, Apr. 5-6, 2001, pp. 1-6.

Nokia: "Channel Interleaver Modification for HSDPA," TSG-RAN WG1 HSDPA ADHOC Meeting TDOC, Nov. 5-7, 2001, pp. 1-6.

Samsung Electronics: "Performance Evaluation of the Enhanced Symbol Mapping Method based on Priority (SMP) in HSDPA," 3GPP TSG-RAN WG1 Meeting #20, May 21-25, 2001, pp. 1-7.

Samsung Electronics: "FER Evaluation of SMP for Different TTI Sizes in HSDPA," 3GPP TSG RAN WG1 ADHOC TDOC R1-01-0738, Jun. 26-28, 2001, pp. 1-4.

Texas Instruments: "Frame Error Rate Based Comparison of Full Bit Level Channel Interleaving, split bit level channel interleaving and symbol based channel interleaving," TSG-RAN Working Group 1 Meeting #20, May 21-25, 2001, pp. 1-10.

3GPP: 3rd Generation Partnership Project; Technical Specification Group Radio Access Network; Physical Layer Aspects of UTRA High Speed Downlink Packet Access, Feb. 27, 2001, pp. 1-92.

* cited by examiner

INTERLEAVING APPARATUS AND METHOD FOR SYMBOL MAPPING IN AN HSDPA MOBILE COMMUNICATION SYSTEM

PRIORITY

This application claims priority to an application entitled "Interleaving Apparatus and Method for Symbol Mapping in an HSDPA Mobile Communication System" filed in the Korean Industrial Property Office on Dec. 21, 2001 and assigned Ser. No. 2001-83064, the contents of which are incorporated herein by reference.

BACKGROUND OF THE INVENTION

1. Field of the Invention

The present invention relates generally to a data transmission/reception apparatus and method in a CDMA (Code Division Multiple Access) mobile communication system, and in particular, to a data transmission/reception apparatus and method for improving reliability of transmission data bits.

2. Description of the Related Art

In reality, in a communication system, it is impossible to receive a transmitted signal without any distortion or noise. Particularly, a mobile communication system that transmits and receives signals through a wireless network is more susceptible to the distortion or noise, compared with a communication system that transmits and receives signals through a wired network.

Therefore, various techniques for minimizing the influence of the distortion or noise have been proposed, and an error control coding technique is one of the typical proposed techniques. Codes used for the error control coding technique are classified into memoryless codes and memory codes. The memoryless codes include linear block codes, and the memory codes include convolutional codes and turbo codes. A device for creating such codes is called a "channel encoder," and its outputs can be divided into systematic bits and parity bits according to the error control coding technique in use. The turbo codes are typically used for the error control coding technique for separately outputting the systematic bits and the parity bits. Of course, in addition to the turbo codes, systematic convolutional codes, a kind of the convolutional codes, are used to separately output the systematic bits and the parity bits. Here, the systematic bits mean actual signals to be transmitted, and the parity bits are signals added to correct a possible transmission error of the systematic bits during decoding. However, even in the case of the error control-coded signals, if a burst error occurs in the systematic bits or parity bits, it is not easy to correct the burst error. Such a phenomenon frequently occurs when a signal passes through a fading channel, and an interleaving technique is typically used to prevent this phenomenon.

The interleaving technique is used to more efficiently overcome the burst error by dispersing a defective part into several positions instead of concentrating the defective part on a particular position.

The interleaved signal undergoes symbol mapping in a digital modulator. Here, if an order of the modulator is increased, the number of bits included in one symbol is also increased. Particularly, in the case of a high-order modulation technique of over 16QAM (16-ary Quadrature Amplitude Modulation), one symbol includes 4 or more information bits, and the information bits can be classified according to their reliability. Here, as to the reliability, in a process of modulating one symbol by a transmitter, a symbol representing two bits in a macro region like the left/right quadrants or upper/lower quadrants on the X/Y-axis has "high reliability," and a symbol representing two bits in a micro region has "low reliability."

FIG. 1 schematically illustrates a structure of a transmitter in an HSDPA (High Speed Downlink Packet Access) mobile communication system. As illustrated, the transmitter includes a channel encoder, an interleaver and a modulator.

Referring to FIG. 1, input information bits to which CRC (Cyclic Redundancy Check) bits, or error detection data, are added in a CRC generator 110, are provided to a channel encoder 120, and the channel encoder 120 encodes the CRC bit-added input information bits through a predetermined coding process, and outputs coded bits, i.e., systematic bits S and parity bits P. The channel encoder 120 has at least one code rate in order to encode the information bits. The code rate may become ½ or ¾. In addition, when the channel encoder 120 supports a plurality of code rates through symbol puncturing or symbol repetition based on a rate R=⅓ or ⅕ mode code, an operation of selecting a particular code rate from the supportable code rates is required. In FIG. 1, for example, the channel encoder 120 determines a code rate under the control of a controller 160. The coded bits are subject to rate matching in a rate matcher 130. Commonly, the rate matching is performed through repetition and/or puncturing on the coded bits, when a transport channel is subject to multiplexing or the output symbols of the channel encoder 120 are not identical in number to the symbols transmitted over the air. The puncturing or repetition function of the rate matcher 130 is identical to the puncturing or repetition function performed to adjust a code rate of the channel encoder 120, the functions can be united. That is, the channel encoder 120 and the rate matcher 130 can be integrated into one block, but they are separately illustrated in FIG. 1, for the sake of convenience. The coded bits rate-matched by the rate matcher 130 are subject to interleaving in an interleaver 140. The interleaving operation is performed to minimize a data loss even though data is lost during transmission. The interleaved coded bits are subject to symbol mapping in a modulator 150 according to a modulation technique of QPSK (Quadrature Phase Shift Keying), 8PSK (8-ary Phase Shift Keying), 16QAM (16-ary Quadrature Amplitude Modulation) or 64QAM. The controller 160 controls a coding operation of the channel encoder 120 and a modulation technique of the modulator 150 according to a current state of a radio channel. In the HSDPA mobile communication system, AMCS (Adaptive Modulation and Coding Scheme) is used for the controller 160 in order to adaptively select one of the modulation techniques QPSK, 8PSK, 16QAM and 64QAM according to the radio environment.

Though not illustrated in the drawing, a CDMA mobile communication system spreads transmission data with a Walsh code W and a PN (Pseudo Noise) orthogonal code (PN) so that a corresponding UE (User Equipment), or a mobile terminal, can identify a channel over which the data is transmitted, and a Node B, or a base station, which transmits the data.

In the transmitter structure stated above, as a matter of course, systematic bits and parity bits output from the channel encoder 120 have different priorities. In other words, in the case where errors occur in transmission data at a certain rate, the transmission data can be decoded more correctly at a receiver when the errors occur in the parity bits, compared with when the errors occur in the systematic bits. The reason is because, as stated above, the systematic bits are the actual data bits, while the parity bits are the bits added to correct the transmission errors during decoding. For this, a symbol mapping (SMP) technique has been proposed, and the SMP technique is disclosed in Korean patent application No. 2001-17925, filed by the applicant on Apr. 4, 2001 the contents of which are incorporated herein by reference.

The SMP technique is a technique for increasing system performance by reducing an error probability of the systematic bits having higher priority than the parity bits. That is, the SMP technique enables the modulator 150 to map the systematic bits with higher priority to the bits with higher reliability among the bits constituting a symbol, and map the parity bits with lower priority to the bits with lower reliability, during symbol mapping based on a predetermined modulation technique. Therefore, in the transmitter of the conventional mobile communication system, it is necessary to improve the interleaver 140 which interleaves coded bits regardless of their priority. That is, in order to apply the SMP technique, the interleaver 140 must be improved such that it can separately interleave the systematic bits and the parity bits.

SUMMARY OF THE INVENTION

It is, therefore, an object of the present invention to provide a method for reducing complexity and securing compatibility with an existing algorithm in realizing an interleaver for a SMP technique.

It is another object of the present invention to provide a data transmission/reception apparatus and method for improving performance of a mobile communication system by realizing an SMP technique for differentially mapping reliabilities according to priority.

It is further another object of the present invention to provide a method for efficiently realizing SMP in a mobile communication system.

It is yet another object of the present invention to provide an algorithm for an interleaver in a mobile communication system.

It is still another object of the present invention to provide an apparatus for realizing SMP in a mobile communication system.

It is still another object of the present invention to provide an apparatus and method for reducing complexity in realizing SMP.

To achieve the above and other objects, the present invention provides a new method for realizing SMP with a minimized increase in complexity and minor modification of the algorithm, compared with an existing interleaving algorithm. Further, the present invention proposes a condition to which the method can be applied.

According to a first aspect of the present invention, the present invention provides a method for interleaving coded bits encoded at a prescribed code rate in a transmitter for a mobile communication system including a buffer having an area comprised of a plurality of rows and columns, for writing the coded bits. The method comprises separating the area of the buffer into a first write area and a second write area according to a ratio of coded bits with higher priority among the coded bits to coded bits with lower priority; sequentially writing a stream of the coded bits with higher priority in a row direction from a first column to a last column among the columns in the first write area, and sequentially writing a stream of the coded bits with lower priority in a row direction from a first column to a last column among the columns in the second write area; permuting the columns in the buffer area according to a given rule; dividing the rows in the buffer area into a first read area and a second read area having the same size; and alternately reading as many bits as a number determined based on a prescribed modulation technique from the first read area and the second read area in such a manner that the bits are sequentially read in a column direction from a first row to a last row among the rows of each of the first read area and the second read area.

According to a second aspect of the present invention, the present invention provides a method for interleaving coded bits encoded at a prescribed code rate in a transmitter for a mobile communication system including a buffer having an area comprised of a plurality of rows and columns, for writing the coded bits. The method comprises separating the area of the buffer into a first write area and a second write area according to a ratio of coded bits with higher priority among the coded bits to coded bits with lower priority; sequentially writing a stream of the coded bits with higher priority in a row direction from a first column to a last column among the columns in the first write area, and sequentially writing a stream of the coded bits with lower priority in a row direction from a first column to a last column among the columns in the second write area; permuting the columns in the buffer area according to a given rule; dividing the rows in the buffer area into a first read area and a second read area having the same size; permuting, between the first read area and the second read area, as many rows as a number determined based on a prescribed modulation technique among the rows of each of the first read area and the second read area; and sequentially reading the rows in the entire buffer area comprised of the first read area and the second read area, in a column direction from a first row to a last row.

According to a third aspect of the present invention, the present invention provides a method for interleaving coded bits encoded at a prescribed code rate in a transmitter for a mobile communication system including a buffer having an area comprised of a plurality of rows and columns, for writing the coded bits. The method comprises separating the area of the buffer into a first write area and a second write area according to a ratio of coded bits with higher priority among the coded bits to coded bits with lower priority; sequentially writing a stream of the coded bits with higher priority in a row direction from a first column to a last column among the columns in the first write area, and writing a stream of the coded bits with lower priority in a row direction from a last column to a first column among the columns in the second write area in such a manner that the stream of coded bits is written in a reverse direction from a last row to a first row in the second write area; permuting the columns in the buffer area according to a given rule; dividing the rows in the buffer area into a first read area and a second read area having the same size; and alternately reading as many bits as a number determined based on a prescribed modulation technique from the first read area and the second read area in such a manner that the bits are sequentially read in a column direction from a first row to a last row among the rows of each of the first read area and the second read area.

According to a fourth aspect of the present invention, the present invention provides a method for interleaving coded bits encoded at a prescribed code rate in a transmitter for a mobile communication system including a buffer having an area comprised of a plurality of rows and columns, for writing the coded bits. The method comprises separating the area of the buffer into a first write area and a second write area according to a ratio of coded bits with higher priority among the coded bits to coded bits with lower priority; sequentially writing a stream of the coded bits with higher priority in a row direction from a first column to a last column among the columns in the first write area, and writing a stream of the coded bits with lower priority in a row direction from a last column to a first column among the columns in the second write area in such a manner that the stream of coded bits is written in a reverse direction from a last row to a first row in the second write area; permuting the columns in the buffer area according to a given rule; dividing the rows in the buffer area into a first read area and a second read area having the same size; permuting, between the first read area and the second read area, as many rows as a number determined based on a prescribed modulation technique among the rows of each of the first read area and the second read area; and sequentially reading the rows in the entire buffer area comprised of the first read area and the second read area, in a column direction from a first row to a last row.

According to a fifth aspect of the present invention, the present invention provides a method for interleaving coded bits encoded at a prescribed code rate in a transmitter for a mobile communication system including two buffers each having an area comprised of a plurality of rows and columns, for writing the coded bits. The method comprises writing coded bits with higher priority among the coded bits in a first buffer and writing coded bits with lower priority in a second buffer, in such a manner that a stream of the coded bits with higher priority is sequentially written in a row direction from a first column to a last column among the columns in the write area of the first buffer and a stream of the coded with lower priority is sequentially written in a row direction from a first column to a last column among the columns in the write area of the second buffer; permuting the columns of the write areas in the first buffer and the second buffer according to a given rule; and alternately reading as many bits as a number determined based on a prescribed modulation technique from the write area of the first buffer and the write area of the second buffer in such a manner that the bits are sequentially read in a column direction from a first row to a last row among the rows of the write areas in each of the first buffer and the second buffer.

According to a sixth aspect of the present invention, the present invention provides an apparatus for interleaving coded bits encoded at a prescribed code rate in a transmitter for a mobile communication system including an encoder for encoding transmission data into coded bits at the prescribed code rate, the coded bits including coded bits with higher priority and coded bits with lower priority, and a buffer having an area comprised of a plurality of rows and columns, for writing the coded bits. The apparatus comprises an interleaver for separating the area of the buffer included therein into a first write area and a second write area according to a ratio of the coded bits with higher priority to the coded bits with lower priority, sequentially writing a stream of the coded bits with higher priority in a row direction from a first column to a last column among the columns in the first write area, and sequentially writing a stream of the coded bits with lower priority in a row direction from a first column to a last column among the columns in the second write area, and permuting the columns in the buffer area according to a given rule. Further, the apparatus comprises a multiplexer for dividing the rows in the buffer area into a first read area and a second read area having the same size, and alternately reading as many bits as a number determined based on a prescribed modulation technique from the first read area and the second read area in such a manner that the bits are sequentially read in a column direction from a first row to a last row among the rows of each of the first read area and the second read area, and multiplexing the read coded bits.

According to a seventh aspect of the present invention, the present invention provides an apparatus for interleaving coded bits encoded at a prescribed code rate in a transmitter for a mobile communication system including an encoder for encoding transmission data into coded bits at the prescribed code rate, the coded bits including coded bits with higher priority and coded bits with lower priority, and a buffer having an area comprised of a plurality of rows and columns, for writing the coded bits. The apparatus comprises an interleaver for separating the area of the buffer into a first write area and a second write area according to a ratio of coded bits with higher priority to coded bits with lower priority; sequentially writing a stream of the coded bits with higher priority in a row direction from a first column to a last column among the columns in the first write area, and sequentially writing a stream of the coded bits with lower priority in a row direction from a first column to a last column among the columns in the second write area; permuting the columns in the buffer area according to a given rule; dividing the rows in the buffer area into a first read area and a second read area having the same size; and permuting, between the first read area and the second read area, as many rows as a number determined based on a prescribed modulation technique among the rows of each of the first read area and the second read area.

According to an eighth aspect of the present invention, the present invention provides an apparatus for interleaving coded bits encoded at a prescribed code rate in a transmitter for a mobile communication system including an encoder for encoding transmission data into coded bits at the prescribed code rate, the coded bits including coded bits with higher priority and coded bits with lower priority, and a buffer having an area comprised of a plurality of rows and columns, for writing the coded bits. The apparatus comprises an interleaver for separating the area of the buffer into a first write area and a second write area according to a ratio of the coded bits with higher priority to the coded bits with lower priority, sequentially writing a stream of the coded bits with higher priority in a row direction from a first column to a last column among the columns in the first write area, and writing a stream of the coded bits with lower priority in a row direction from a last column to a first column among the columns in the second write area in such a manner that the stream of coded bits is written in a reverse direction from a last row to a first row in the second write area, and permuting the columns in the buffer area according to a given rule. Further, the apparatus comprises a multiplexer for dividing the rows in the buffer area into a first read area and a second read area having the same size, alternately reading as many bits as a number determined based on a prescribed modulation technique from the first write area and the second write area, and sequentially reading coded bits in a column direction from a first row to a last row among the rows in the first read area and the second read area, and multiplexing the read coded bits.

According to a ninth aspect of the present invention, the present invention provides an apparatus for interleaving coded bits encoded at a prescribed code rate in a transmitter for a mobile communication system including an encoder for encoding transmission data into coded bits at the prescribed code rate, the coded bits including coded bits with higher priority and coded bits with lower priority, and a buffer having an area comprised of a plurality of rows and columns, for writing the coded bits. The apparatus comprises an interleaver for separating the area of the buffer into a first write area and a second write area according to a ratio of coded bits with higher priority to coded bits with lower priority; sequentially writing a stream of the coded bits with higher priority in a row direction from a first column to a last column among the columns in the first write area, and writing a stream of the coded bits with lower priority in a row direction from a last column to a first column among the columns in the second write area in such a manner that the stream of coded bits is written in a reverse direction from a last row to a first row in the second write area; permuting the columns in the buffer area according to a given rule; dividing the rows in the buffer area into a first read area and a second read area having the same size; and permuting, between the first read area and the second read area, as many rows as a number determined based on a prescribed modulation technique among the rows of each of the first read area and the second read area.

According to a tenth aspect of the present invention, the present invention provides an apparatus for interleaving coded bits encoded at a prescribed code rate in a transmitter for a mobile communication system including an encoder for encoding transmission data into coded bits at the prescribed code rate, the coded bits including coded bits with higher priority and coded bits with lower priority, and buffers each having an area comprised of a plurality of rows and columns, for writing the coded bits. The apparatus comprises an interleaver including a first buffer for sequentially writing a stream of the coded bits with higher priority in a row direction from a first column to a last column among the columns in the write area thereof, and a second buffer for sequentially writing a stream of the coded bits with lower priority in a row direction from a first column to a last column among the columns in the write area thereof, the interleaver permuting the columns of the write areas in the first buffer and the second buffer according to a given rule; and a multiplexer for alternately reading as many bits as a number determined based on a prescribed modulation technique from the write area of the first buffer and the write area of the second buffer in such a manner that the bits are sequentially read in a column direction from a first row to a last row among the rows of the write areas in each of the first buffer and the second buffer, and multiplexing the read coded bits.

According to a eleventh aspect of the present invention, the present invention provides a method for deinterleaving coded bits demodulated by a prescribed demodulation technique in a receiver for a mobile communication system including a buffer having an area comprised of rows and columns, for writing the coded bits. The method comprises demultiplexing the coded bits at prescribed periods; separating a use area of the buffer into a first write area and a second write area having the same size; sequentially writing one demultiplexed output into the first write area and sequentially writing another demultiplexed output into the second write area; dividing the use area into a first read area and a second read area according to a ratio of coded bits with higher priority among the coded bits to coded bits with lower priority; and reading coded bits from the first read area and the second read area according to the ratio of the coded bits with higher priority to the coded bits with lower priority.

According to a twelfth aspect of the present invention, the present invention provides an apparatus for deinterleaving coded bits demodulated by a prescribed demodulation technique in a receiver for a mobile communication system including a buffer having an area comprised of rows and columns, for writing the coded bits. The apparatus comprises a deinterleaver for separating a use area of the buffer into a first write area and a second write area having the same size; sequentially writing one demultiplexed output into the first write area and sequentially writing another demultiplexed output into the second write area; dividing the use area into a first read area and a second read area according to a ratio of coded bits with higher priority among the coded bits to coded bits with lower priority; and reading coded bits from the first read area and the second read area according to the ratio of the coded bits with higher priority to the coded bits with lower priority, and deinterleaving the read coded bits.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

The present invention provides examples for an interleaver required for applying the SMP technique. Commonly, in a mobile communication system, an amount of (or the number of) systematic bits and the number of parity bits, mapped to each symbol, are different according to a code rate and a modulation technique. Therefore, in order to adjust the number of systematic bits and parity bits, an input of a modulator must be formed in a proper pattern according to the above condition. That is, an interleaver for applying the SMP technique must be improved such that it can separately interleave the systematic bits and the parity bits. There are several methods for realizing such an interleaver arranged in front of the modulator according to a given condition.

The method for improving an interleaver can be divided into one method for separating the interleaver physically and another method for separating the interleaver logically. The physical separation method separates the interleaver into an interleaver for interleaving coded bits with higher priority and an interleaver for interleaving coded bits with lower priority. The logical separation method separates a storage area of a buffer included in one interleaver into an area for storing coded bits with higher priority and an area for storing coded bits with lower priority.

1. Physical Separation Method

Figure 1:
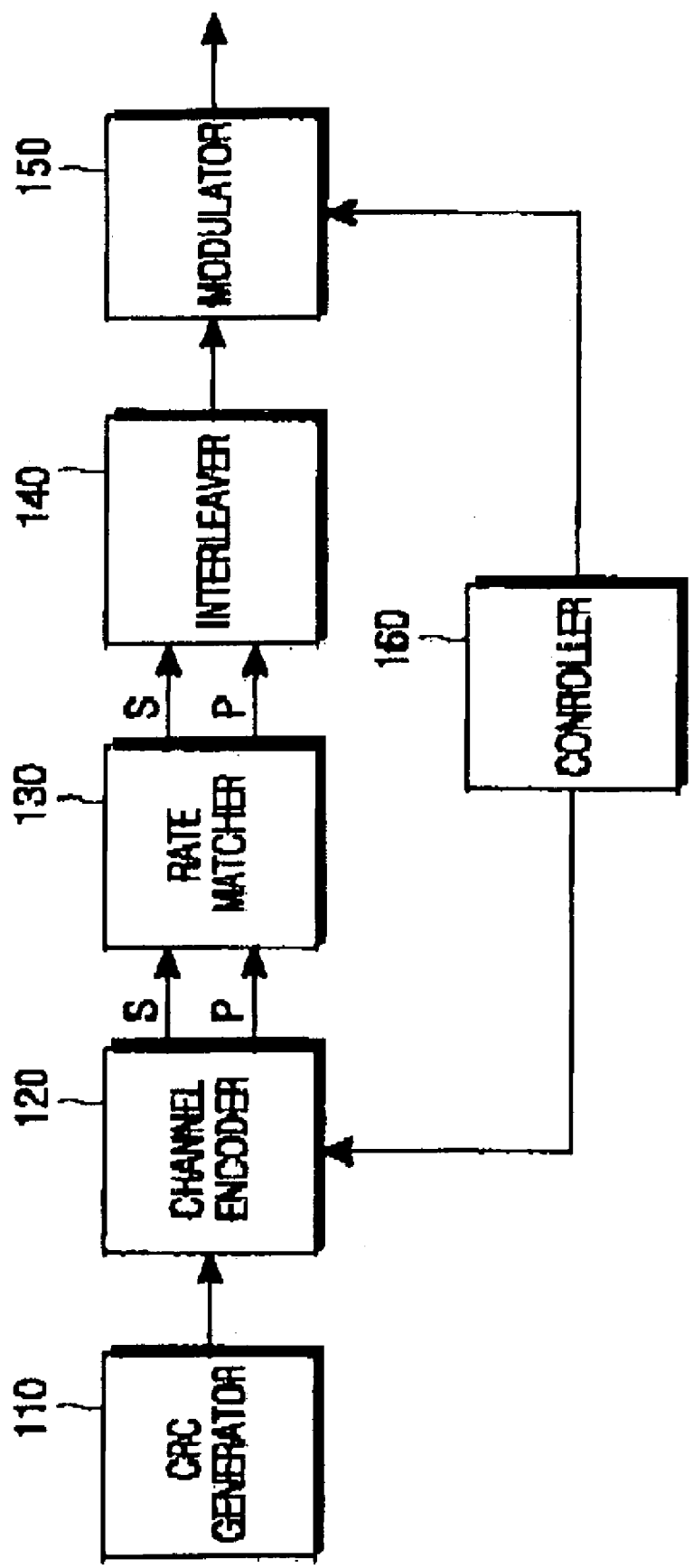
FIG. 1 is a block diagram illustrating a structure of a high-speed packet transmission system according to the prior art.
Figure 2:
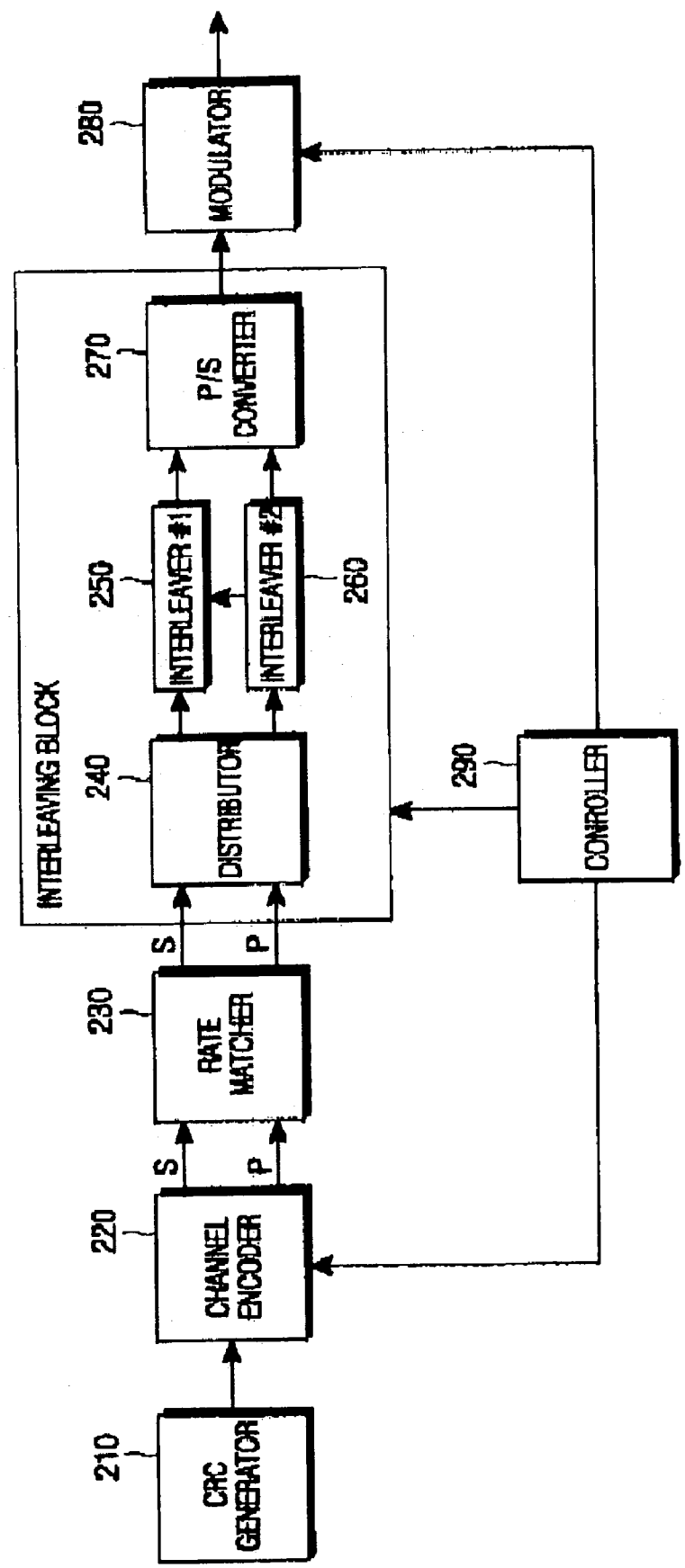
FIG. 2 is a block diagram illustrating a structure of a high-speed packet transmission system supporting SMP for differentially mapping reliabilities according to priority, according to an embodiment of the present invention.

FIG. 2 illustrates a structure of a high-speed packet transmission system to which the SMP technique is applied using two physically-separated interleavers. The structure of FIG. 2 includes two physically-separated interleavers, and the systematic bits S and the parity bits P are separately interleaved by the different interleavers. To this end, an interleaving block includes a distributor 240, two interleavers 250 and 260, and a parallel-to-serial (P/S) converter 270.

Referring to FIG. 2, the distributor 240 properly distributes input coded bits to the two interleavers 250 and 260. For example, the distributor 240 distributes the bits with higher priority among the coded bits to the first interleaver 250, and the bits with lower priority to the second interleaver 260. In addition, if a code rate for encoding is asymmetric, the distributor 240 can uniformly distribute the coded bits to the first interleaver 250 and the second interleaver 260 according to priority of the coded bits and the code rate. Meanwhile, the first interleaver 250 and the second interleaver 260 separately interleave the coded bits distributed from the distributor 240, and provide the interleaved coded bits in parallel to the P/S converter 270. The P/S converter 270 converts the interleaved coded bits provided in parallel into serial data in the form of a proper bit stream according to a code rate and a modulation technique. To this end, the P/S converter 270 should be able to select the two inputs in series for a variable period according to the code rate and the modulation technique under the control of a controller.

Figure 3:
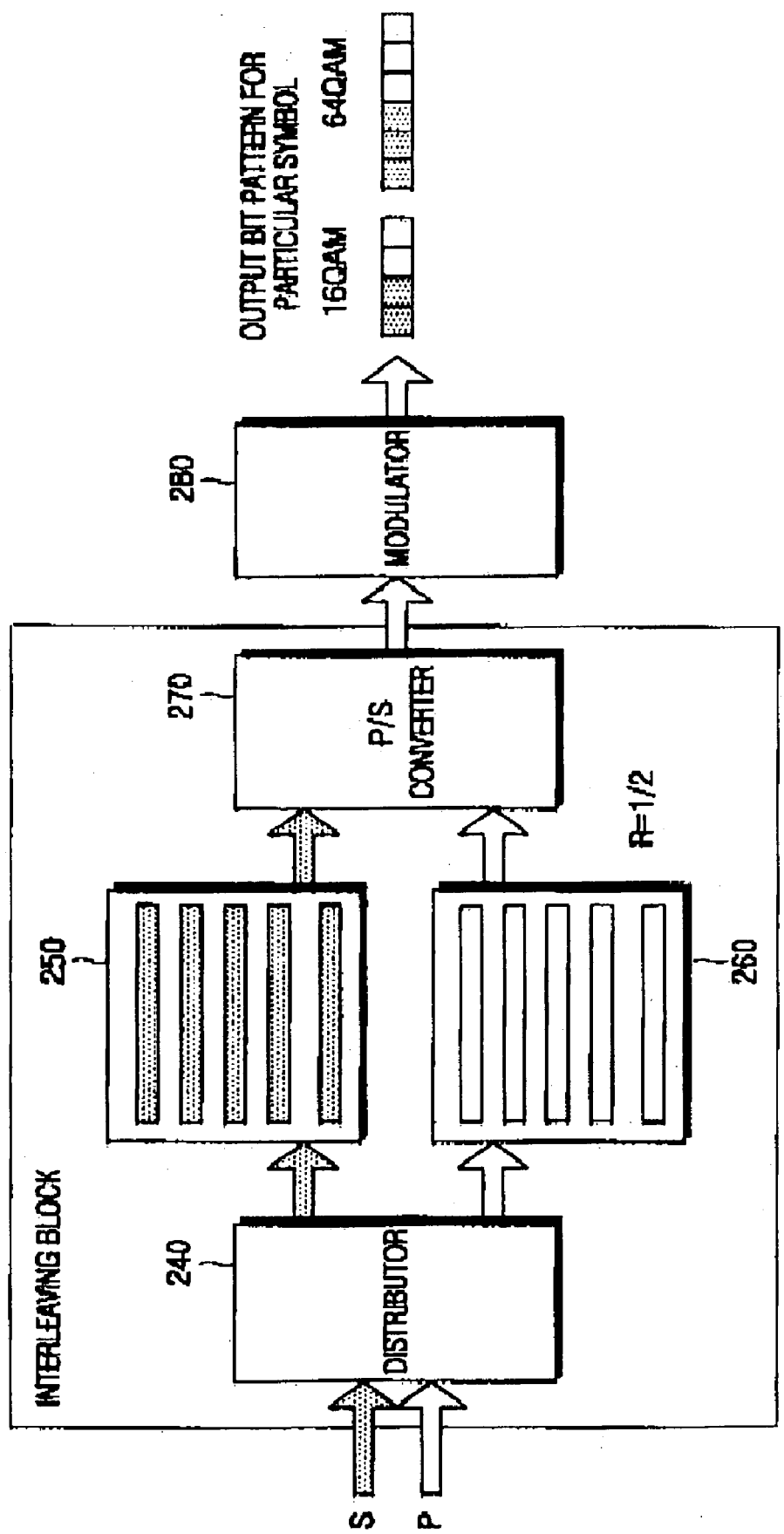
FIG. 3 is a block diagram illustrating a process of mapping systematic bits and parity bits, applied in the same ratio to two physically separated interleaving buffers having a sufficient size, to a 16QAM or 64QAM-modulated symbol in the case where a code rate is ½, according to an embodiment of the present invention.
Figure 4:
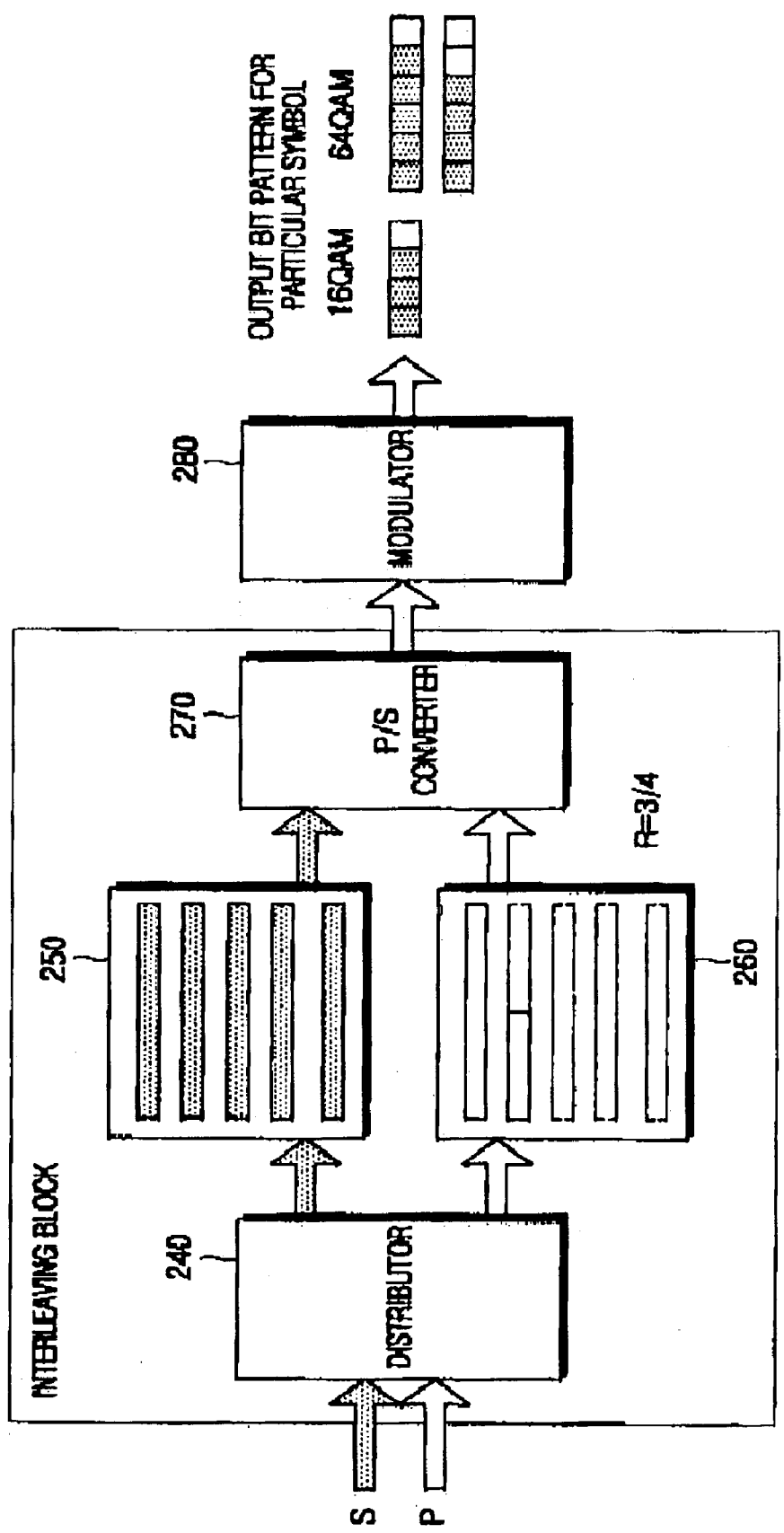
FIG. 4 is a block diagram illustrating a process of mapping systematic bits and parity bits, applied in a different ratio to two physically separated interleaving buffers having a sufficient size, to a 16QAM or 64QAM-modulated symbol in the case where a code rate is ¾, according to an embodiment of the present invention.
Figure 5:
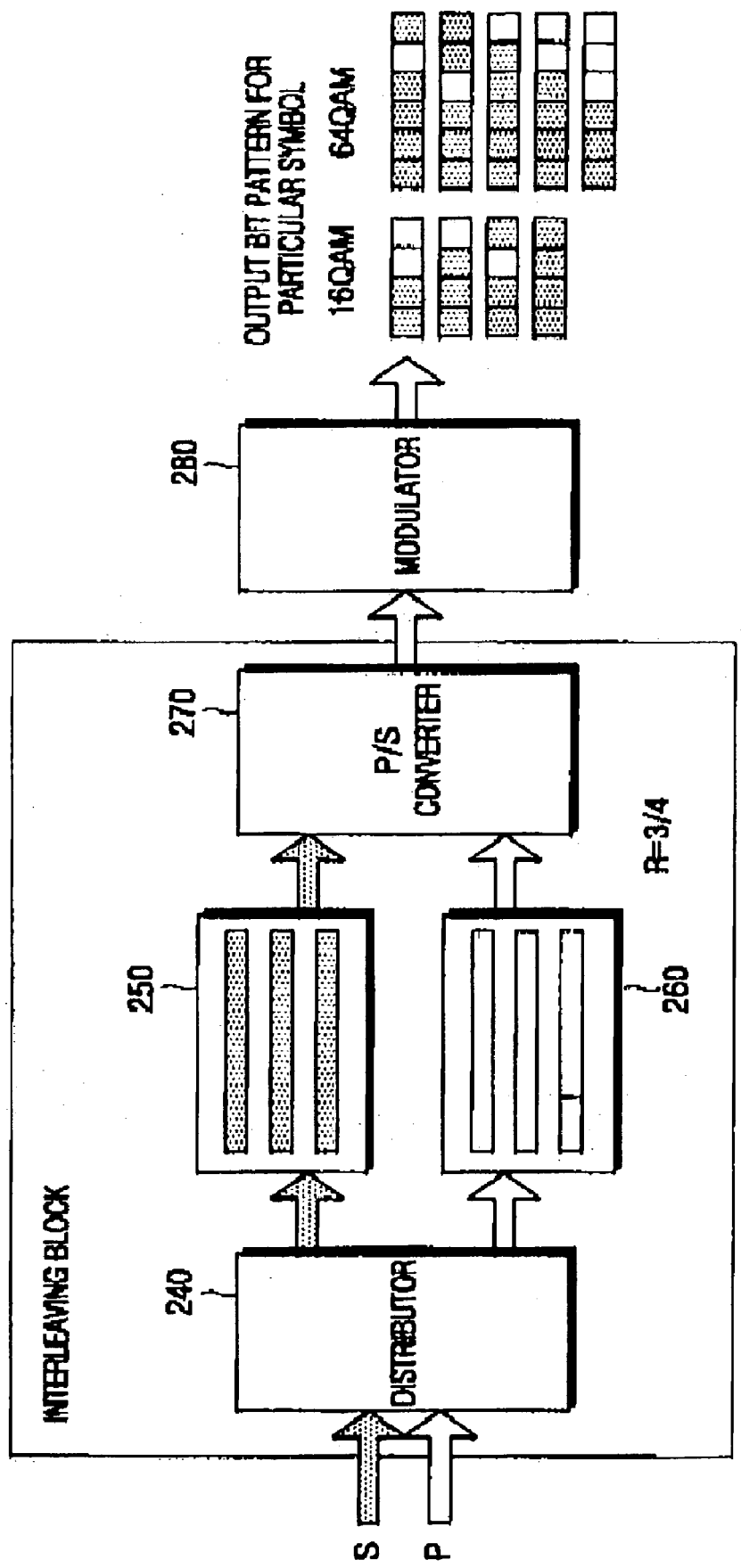
FIG. 5 is a block diagram illustrating a process of mapping systematic bits and parity bits, applied in a different ratio to two physically separated interleaving buffers having a minimum size, to a 16QAM or 64QAM-modulated symbol in the case where a code rate is ¾, according to an embodiment of the present invention.

Meanwhile, examples of applying the SMP technique using the two physically-separated interleavers are illustrated in FIGS. 3 to 5.

Referring to FIG. 3, in the case where a code rate is ½, and the systematic (S) bits and the parity (P) bits are properly distributed to the two interleavers 250 and 260, the systematic bits and the parity bits can be mapped to H positions with higher reliability and L positions with lower reliability of each symbol by a modulator 280, respectively. Here, the distributor 240 is optional, and the P/S converter 270 simply serves as a multiplexer (MUX).

Referring to FIG. 4, in the case where a code rate is ¾, and the two interleavers 250 and 260 sufficiently receive the systematic bits and the parity bits, an output pattern of the modulator 280 can become optimal as described in conjunction with FIG. 3. Likewise, the distributor 240 in FIG. 4 is also optional. As illustrated in FIG. 4, since two patterns are required for 64QAM, the P/S converter 270 must control its operation according to a modulation order. For example, the P/S converter 270 outputs 1 parity bit per 5 systematic bits for an initial symbol, and outputs 2 parity bits for 4 systematic bits for the next symbol. For an operation proper to the modulation technique and the code rate, the P/S converter 270 plays an important role.

Referring to FIG. 5, in the case where a size of a first buffer 250 is smaller than the total number of systematic bits, a second buffer 260 must accept the excessive number of systematic bits. As illustrated, in the case of 16QAM, there is no output pattern which violates a general idea of SMP. However, in the case of 64QAM, some patterns are formed such that the systematic bits can be mapped to the bit positions having higher reliability than the parity bits. The reason is because after the input bits of the second buffer 260 are randomly interleaved, the P/S converter 270 cannot distinguish the systematic bits and the parity bits stored in the second buffer 260.

As can be understood from FIGS. 3 to 5, if the size of the buffer (buffer size={the number of systematic bits}+{the number of parity bits}) is minimized, a symbol pattern for the 64QAM cannot be optimally mapped. In other words, in the case where the interleaving buffer is physically separated, if a high-order modulation technique of 64QAM is applied, it is necessary to sufficiently increase the sizes of the two buffers for all code rates, in order to create optimal mapping patterns. However, in the case of the modulation technique with a modulation order of below 16QAM, the optimal mapping patterns can be generated even though the size of the buffer is minimized.

Herein, the present invention provides a method for minimizing a size of the buffer to minimize hardware complexity as described in conjunction with FIG. 5, in the case where the modulation technique with a modulation order of below 16QAM is used. In addition, the present invention provides a method for modifying the existing 3GPP Re199 interleaving algorithm.

Figure 6:
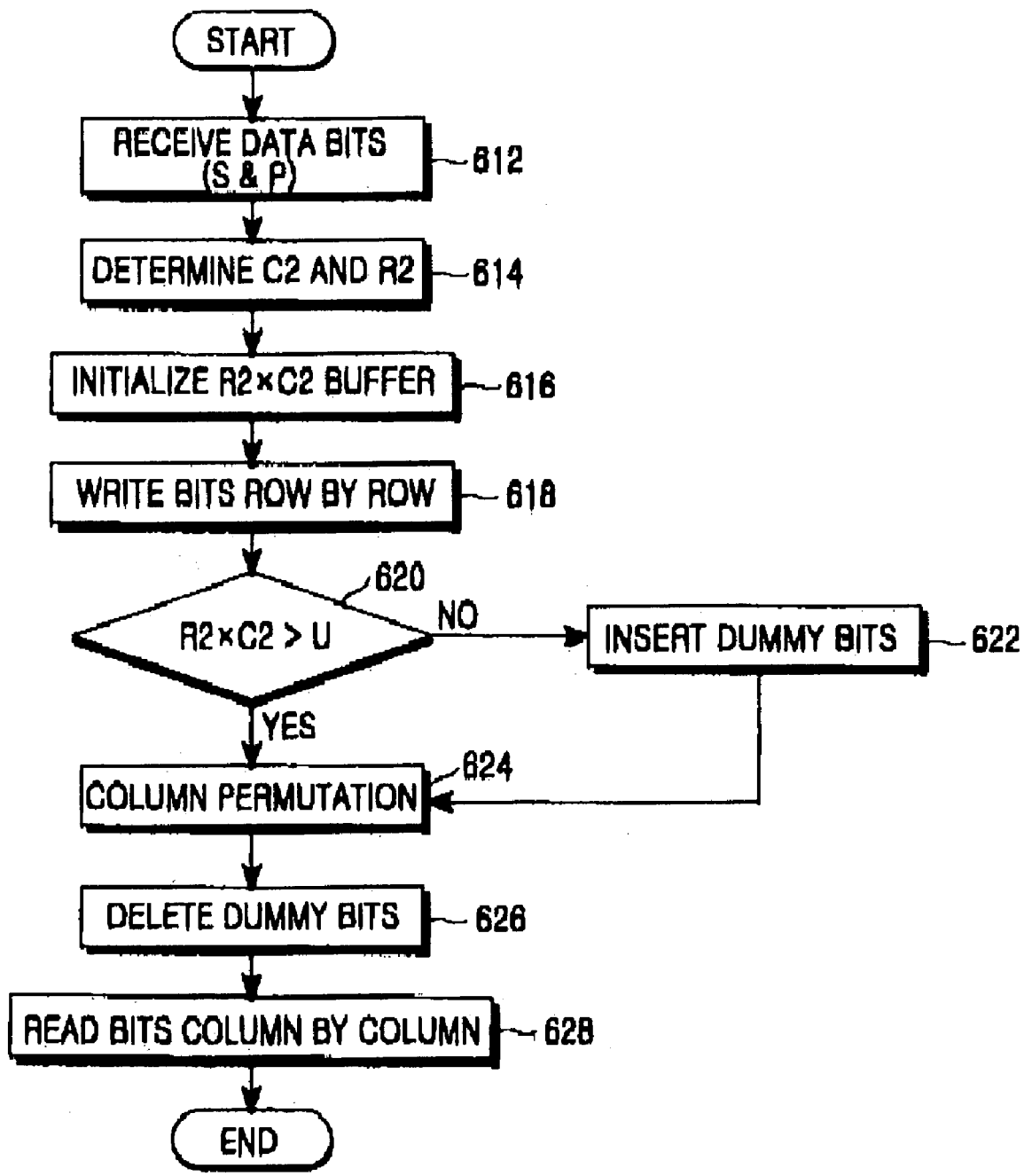
FIG. 6 is a flowchart illustrating a process of applying an SMP technique by physically separating an interleaver according to an embodiment of the present invention.

FIG. 6 is a flowchart illustrating a method for applying an SMP technique using physically-separated interleavers according to an embodiment of the present invention. With reference to FIG. 6, a method for applying the SMP technique using physically-separated interleavers will be described.

Referring to FIG. 6, a block interleaver with an inter-column permutation (or column permutation) function is used for interleaving. The interleaver receives $u_{p,1}$, $u_{p,2}$, $u_{p,3}$, . . . , $u_{p,U}$ (Step 612). Here, p represents the number of physical channels, and U represents the number of bits per frame of a physical channel.

(1) First, the total number of columns C2 is set to 30 (Step 614). The columns are assigned column numbers 0, 1, 2, . . . , C2−1 from left to right.

(2) The minimum integer indicating a row of a matrix R2, satisfying a condition of U≦R2×C2, is determined. The rows of the matrix are assigned row numbers 0, 1, 2, . . . , R2−1 from top to bottom (Step 616).

(3) The inputs $u_{p,1}$, $U_{p,2}$, $u_{p,3}$, . . . , $u_{p,U}$ are written row by row in an R2×C2 rectangular matrix beginning at position $y_{p,1}$ in a $0^{th}$ row and a $0^{th}$ column (Step 618), in accordance with Equation (1).

$$\begin{bmatrix} y_{p,1} & y_{p,2} & y_{p,3} & \cdots & y_{p,C2} \\ y_{p,(C2+1)} & y_{p,(C2+2)} & y_{p,(C2+3)} & \cdots & y_{p,(2\times C2)} \\ \vdots & \vdots & \vdots & \cdots & \vdots \\ y_{p,((R2-1)\times C2+1)} & y_{p,((R2-1)\times C2+2)} & y_{p,((R2-1)\times C2+3)} & \cdots & y_{p,(R2\times C2)} \end{bmatrix}$$ Equation (1)

Here, $Y_{p,k}=U_{p,k}$ for k=1, 2, . . . , U. If R2×C2>U (Step 620), then dummy bits of $Y_{p,k}=0$ or 1 (for k=U+1, U+2, . . . , R2×C2) are inserted (Step 622). The dummy bits are deleted (Step 626) after being subject to column permutation (Step 624).

(4) After the column permutation is performed according to a rule (Step 624), the resulting bits $Y'_{p,k}$ are expressed as $$\begin{bmatrix} y'_{p,1} & y'_{p,(R2+1)} & y'_{p,(2\times R2+1)} & \cdots & y'_{p,((C2-1)\times R2+1)} \\ y'_{p,2} & y'_{p,(R2+2)} & y'_{p,(2\times R2+2)} & \cdots & y'_{p,((C2-1)\times R2+2)} \\ \vdots & \vdots & \vdots & \cdots & \vdots \\ y'_{p,R2} & y'_{p,(2\times R2)} & y'_{p,(3\times R2)} & \cdots & y'_{p,(C2\times R2)} \end{bmatrix}$$ Equation (2)

(5) Outputs of the block interleaver are read column by column from the column-permuted R2×C2 matrix (Step 628). The outputs are represented by $v_{p,1}$, $V_{p,2}$, $V_{p,3}$, . . . , $V_{p,U}$.

However, in the normal SMP technique, since two interleavers are physically separated, a distributor for properly distributing systematic bits and parity bits, the number of which is variable according the code rate, to the two interleavers is necessarily required. If the distributor is not provided, each of the interleavers must have a buffer capable of storing the entire input coded bits. The reason is because in a high-speed packet transmission system supporting an HARQ (Hybrid Automatic Retransmission Request) technique, only systematic bits or parity bits can be transmitted during retransmission when occasion demands.

Meanwhile, in the case where the two interleavers are physically separated, in order to convert outputs from each of the two separated interleavers into one bit stream, a serial-to-parallel (S/P) converter controlled by a control signal from an external device is necessarily required.

2. First Embodiment of Logical Separation Method

Now, a first embodiment for realizing the SMP technique by logically separating a buffer included in one interleaver will be described.

2.1 Structure of Transmitter According to First Embodiment

Figure 7:
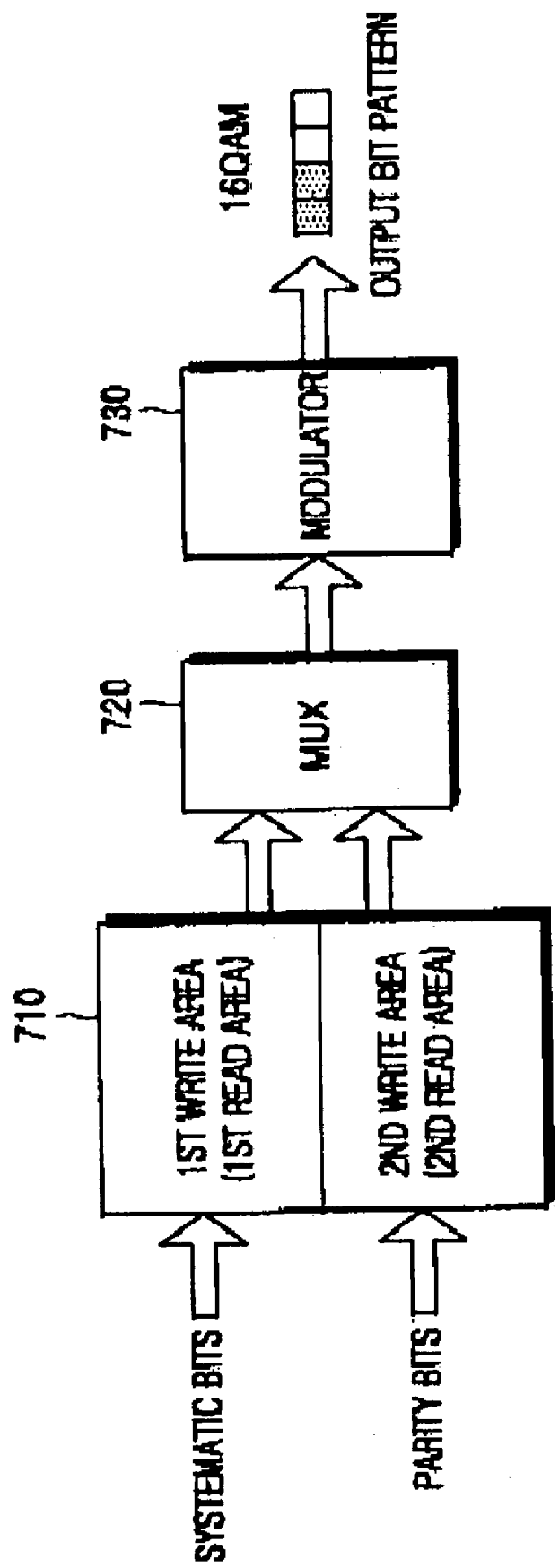
FIG. 7 is a block diagram illustrating a structure of a transmitter according to a first embodiment of the present invention.

FIG. 7 illustrates a structure of a transmitter for realizing the SMP technique by logically separating a buffer included in one interleaver according to the first embodiment of the present invention.

Figure 8A:
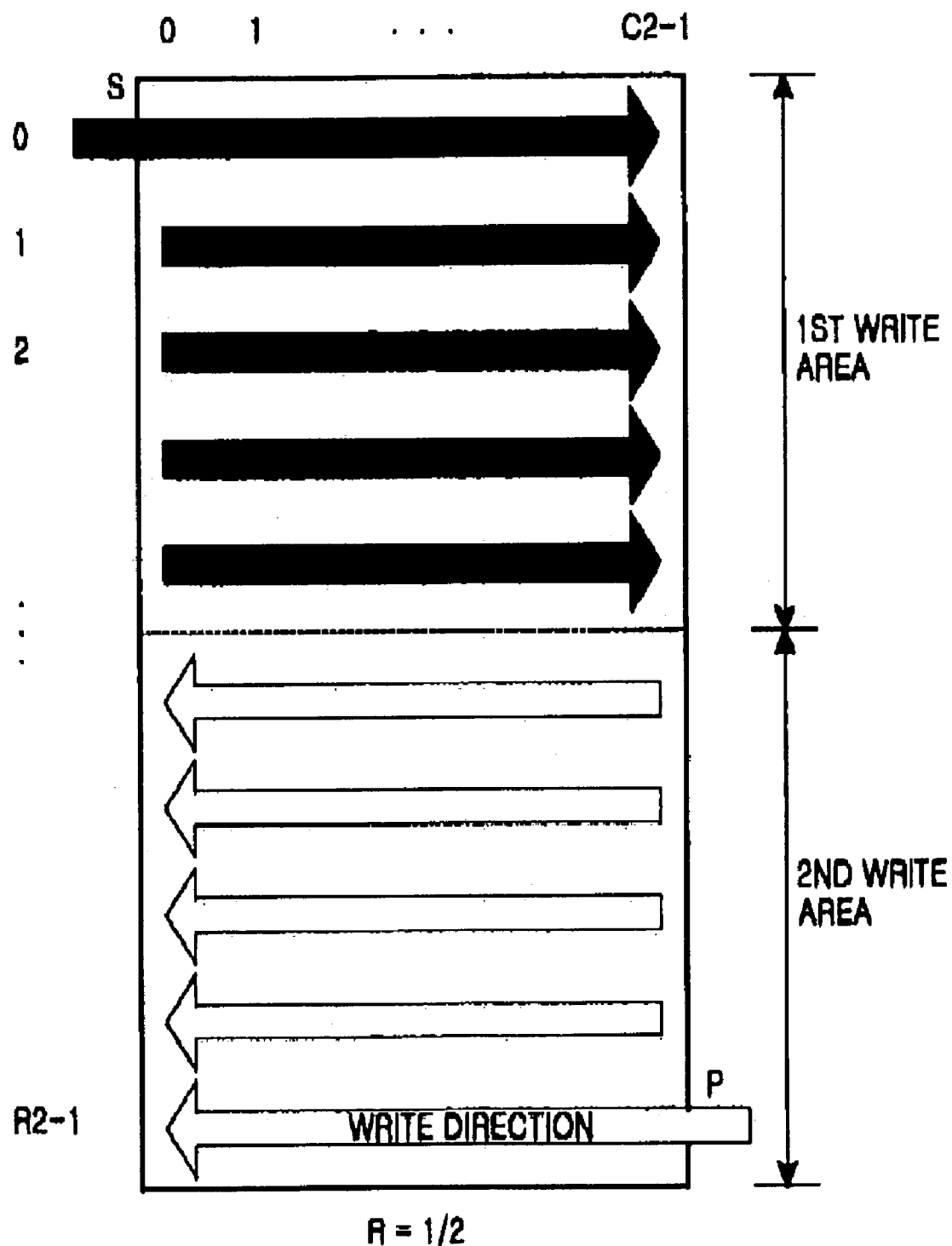
FIGS. 8A and 8B illustrate examples of a writing process for a code rate ½ according to a first embodiment of the present invention.
Figure 8B:
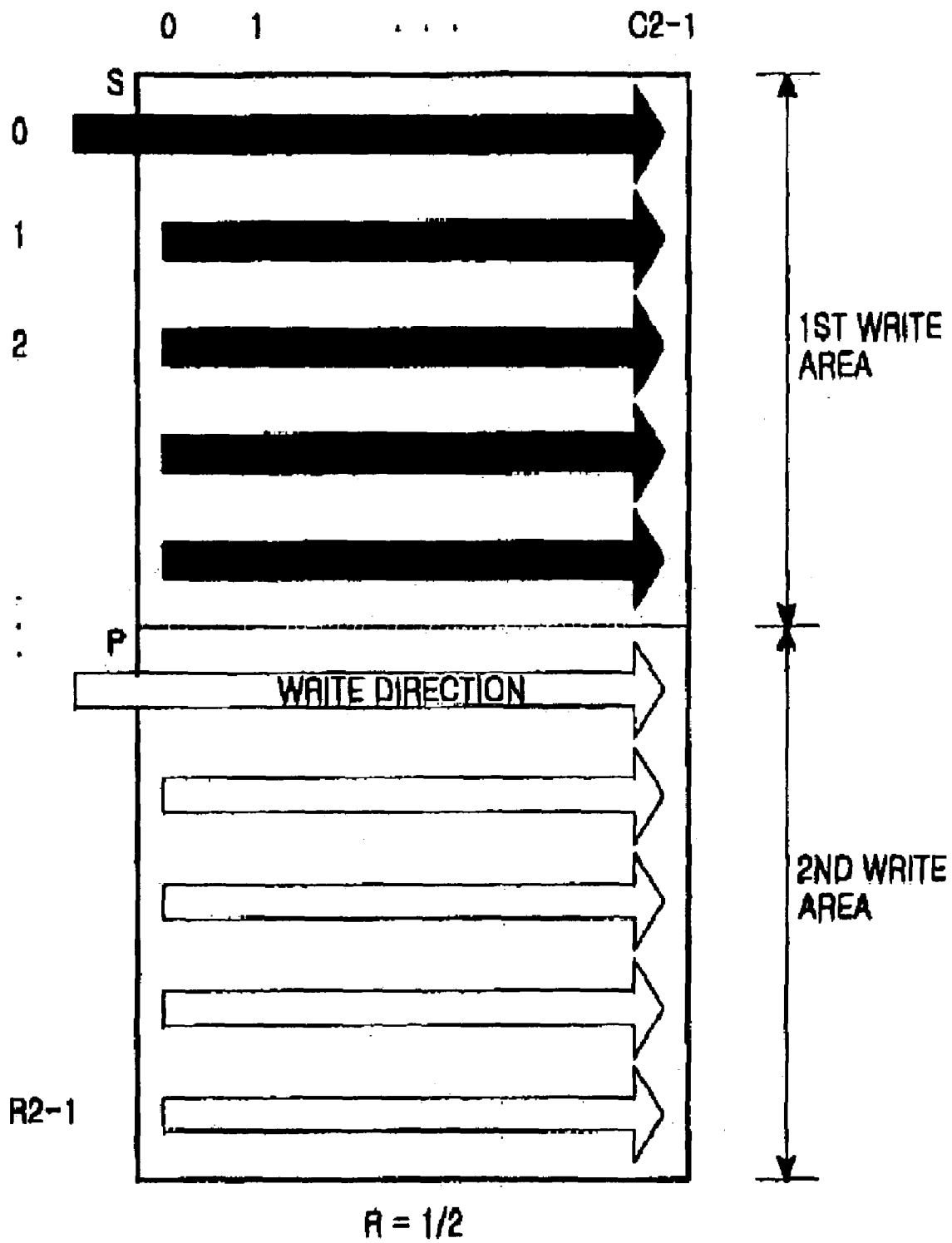
Figure 9A:
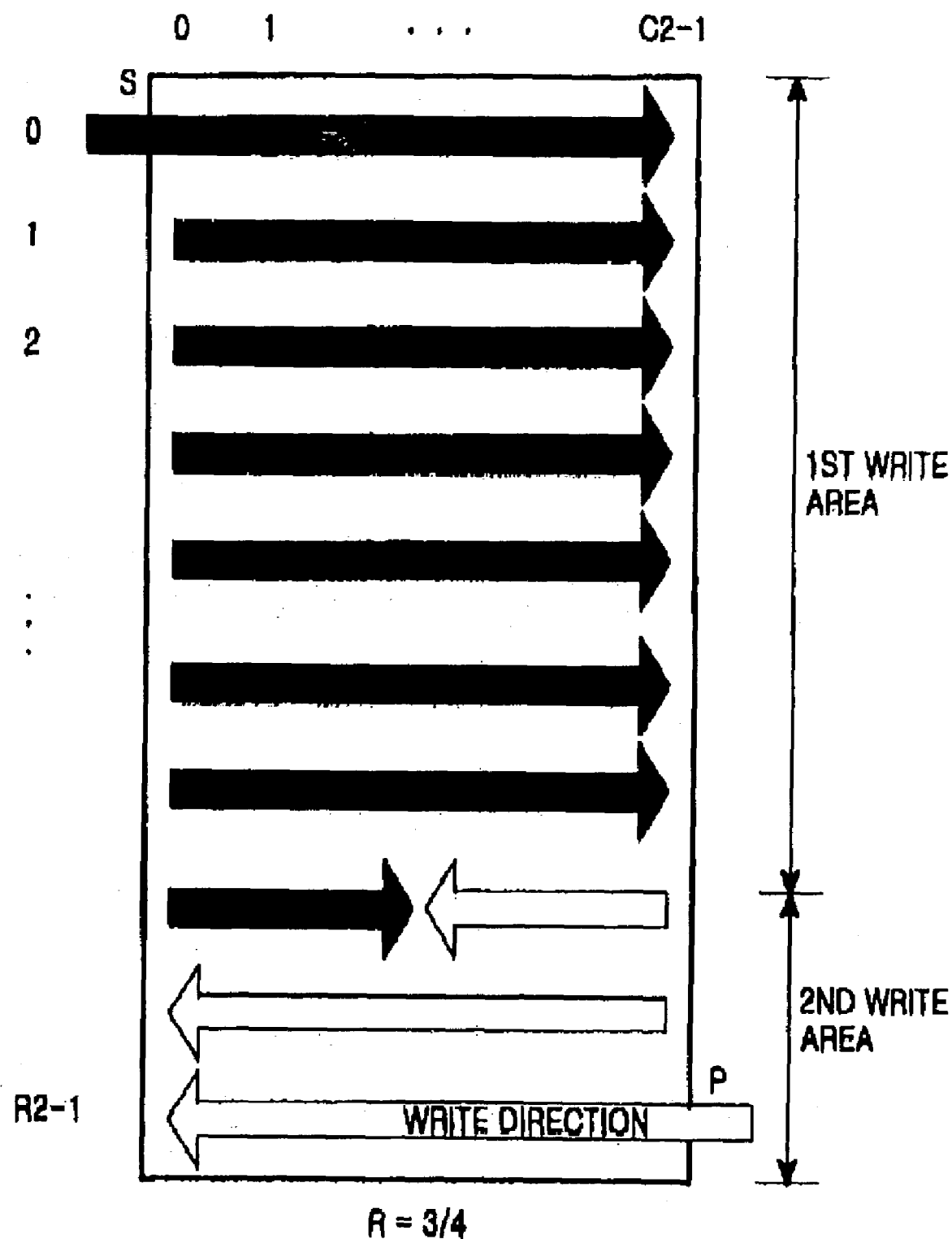
FIGS. 9A and 9B illustrate examples of a writing process for a code rate ¾ according to the first embodiment of the present invention.
Figure 9B:
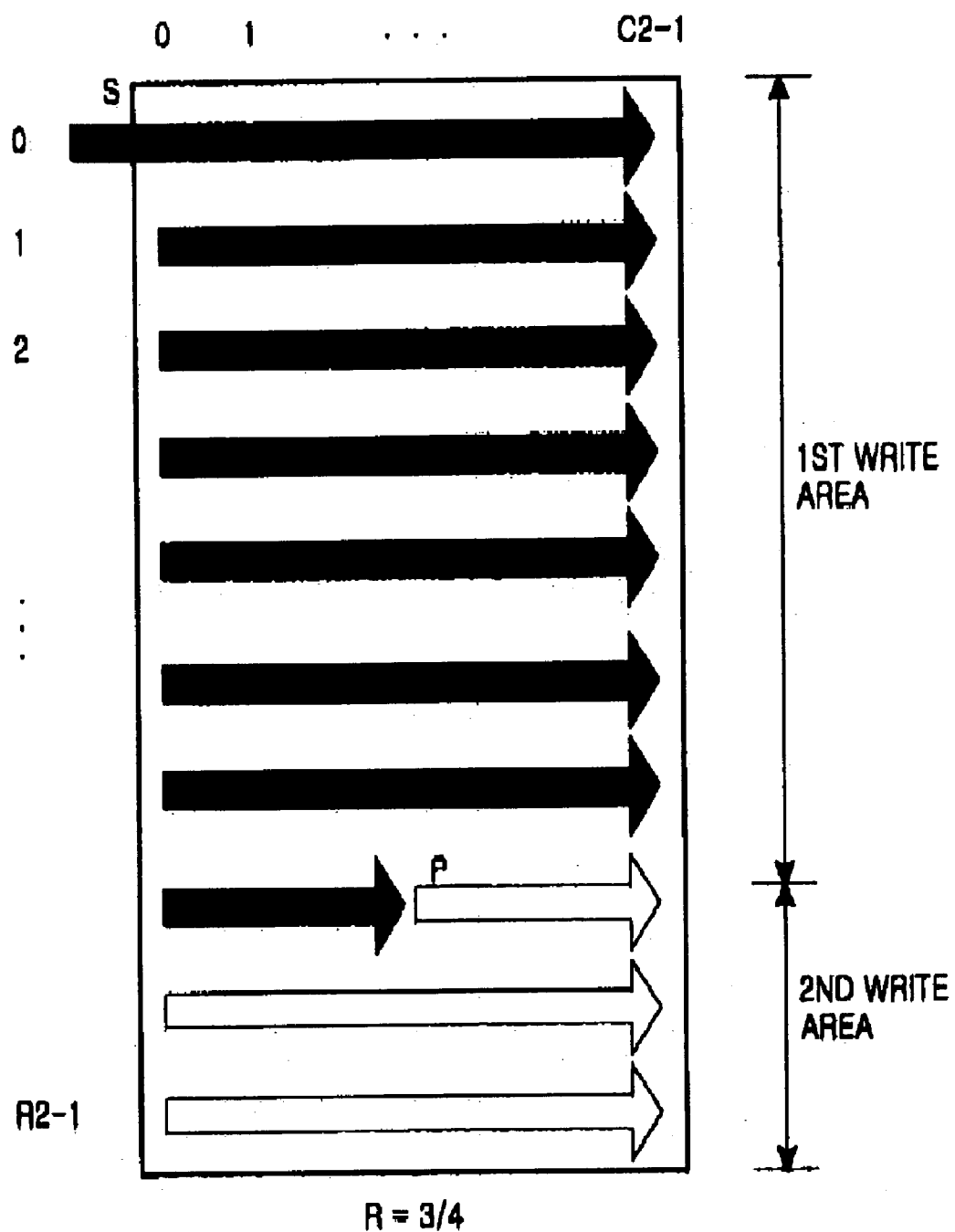

Referring to FIG. 7, an interleaver 710 includes a buffer having a prescribed area therein. The prescribed area of the buffer means a partial area determined by the total number of coded bits received from an encoder (not shown). Hereinafter, the prescribed area determined by the total number of coded bits will be referred to as "use area" (or an area in use). The interleaver 710 divides the determined use area into two virtual write areas of a first write area and a second write area according to a ratio of the bits with first priority (hereinafter, referred to as "systematic bits") to the bits with second priority (hereinafter, referred to as "parity bits"), constituting the coded bits. Here, the ratio of the systematic bits to the parity bits is determined depending on a code rate used by the encoder. For example, if the code rate is ½, the use area is equally divided into two virtual write areas having the same size, and one of the two areas is defined as the first write area and the other area is defined as the second write area. FIGS. 8A and 8B illustrate an example of the interleaver 710 in which the first write area and the second write area are equal in size. However, if the code rate is ¾, the use area is equally divided into four areas having the same size, and three of the four areas are defined as a first write area and the remaining one area is defined as a second write area. FIGS. 9A and 9B illustrate an example of the interleaver 710 in which the first write area and the second write area are asymmetric in size. It is assumed in FIG. 7 that the interleaver 710 equally divides the use area into the first write area and the second write area, for the code rate ½.

Upon receiving coded bits from the encoder, the interleaver 710 sequentially writes the systematic bits among the coded bits in the first write area, and sequentially writes the parity bits in the second write area. Here, the interleaver 710 inserts dummy bits into an area left over after writing the systematic bits in the first write area, and inserts the dummy bits into an area left over after writing the parity bits in the second write area. Exemplary methods of writing the systematic bits and exemplary methods of writing the parity bits are illustrated in FIGS. 8A to 10D.

After completion of writing the systematic bits and the parity bits in this manner, the interleaver 710 interleaves the coded bits including the dummy bits stored in the use area through column permutation. The column permutation permutes the coded bits in the use area column by column, so that the written systematic bits are never mixed with the parity bits.

Further, the interleaver 710 equally divides the use area into a first read area and a second read area in order to read the written coded bits. Therefore, if the code rate is ½, the first read area is identical to the first write area, and the second read area is identical to the second write area. Thus, only the systematic bits are previously written in the first read area, and only the parity bits are previously written in the second read area. However, if the code rate is ¾, the first write area includes the first read area and a part of the second read area, and the remaining part of the second read area becomes the second write area. Thus, only the systematic bits are previously written in the first read area, and the systematic bits and the parity bits are previously written in the second read area row by row.

Figure 11A:
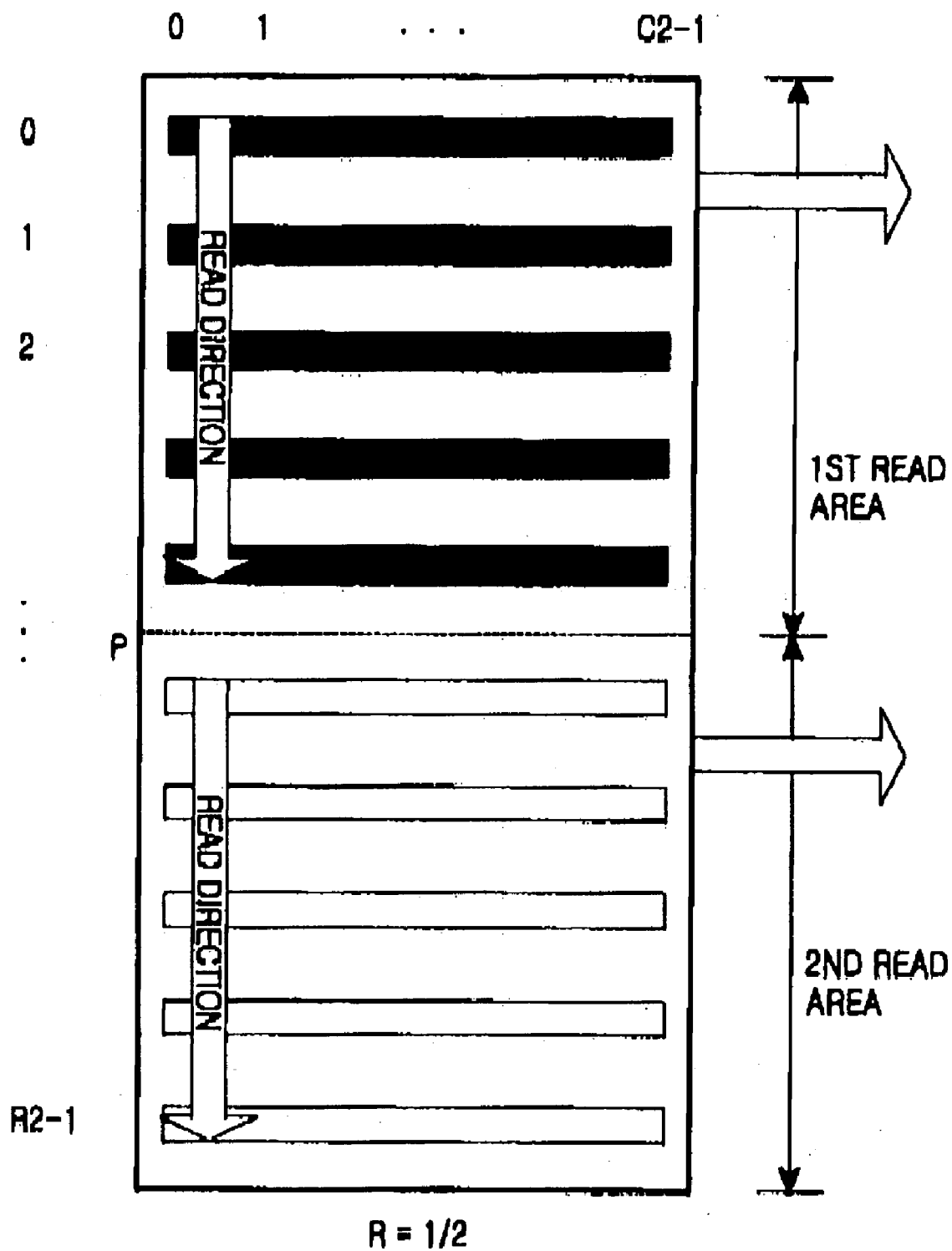
FIGS. 11A and 11B illustrate examples of a process of reading coded bits according to the first embodiment of the present invention.
Figure 11B:
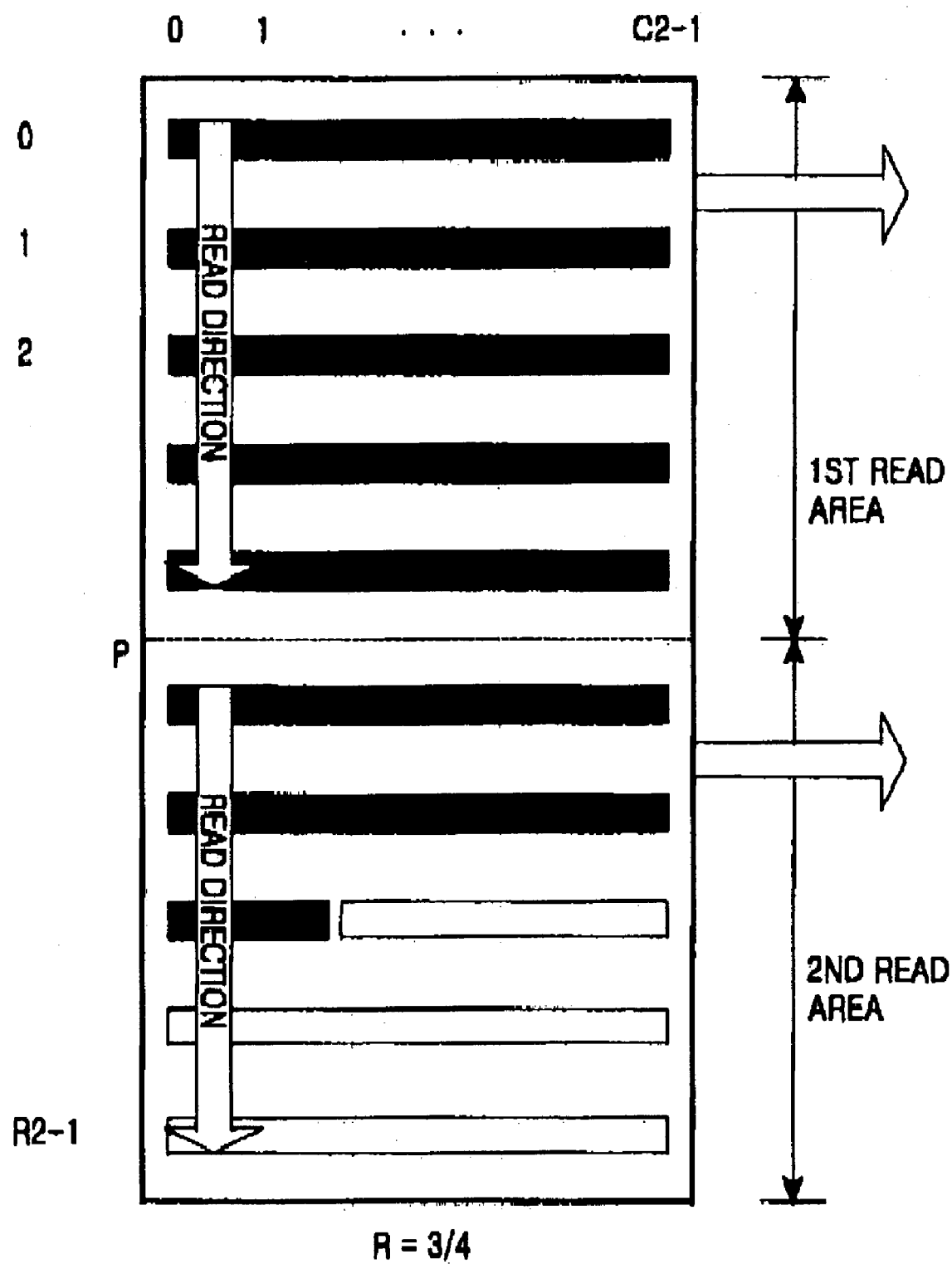

After interleaving, the interleaver 710 sequentially reads the coded bits written in the first read area and the second read area. Exemplary methods of reading the coded bits from the first read area and the second read area are illustrated in FIGS. 11A and 11B. Herein, the column permutation operation and the reading operation for interleaving have been separately described. However, it would be obvious to those skilled in the art that the column permutation operation and the reading operation can be united into one operation by changing the order of reading.

The coded bits read from the first read area and the second read area of the interleaver 710, are provided to a multiplexer (MUX) 720. The MUX 720 multiplexes the coded bits from the first read area and the second read area in a prescribed ratio, and outputs one bit stream. The ratio for multiplexing the coded bits from the first read area and the coded bits from the second read area is determined depending on the modulation technique used by a modulator 730. For example, if the modulation technique is 16QAM, 4 coded bits are mapped to one symbol. In this case, the MUX 720 multiplexes the 2 coded bits from the first read area and the 2 coded bits from the second read area, for each symbol.

The coded bits multiplexed by the MUX 720 are applied to the modulator 730. The modulator 730 performs symbol mapping on the multiplexed coded bits. For example, when using a modulation technique of 16QAM, the modulator 730 maps 2 coded bits read from the first read area to the bits with higher reliability (hereinafter, referred to as "first reliability") of a particular symbol. Further, the modulator 730 maps 2 coded bits read from the second read area to the bits with lower reliability (hereinafter, referred to as "second reliability") of the symbol.

As stated above, the present invention provides a method for interleaving the systematic bits and the parity bits by logically separating one interleaver, so that the modulator can perform symbol mapping by the SMP technique.

2.2 Writing of Coded Bits

A method of writing coded bits in the buffer included in the interleaver 710 according to an embodiment of the present invention can be divided into one case where dummy bits are used and another case where the dummy bits are not used. The dummy bits are used to fill an area left over after writing coded bits in the use area of the buffer, determined depending on the total number of the coded bits provided form the encoder. The dummy bits are deleted after being subject to column permutation for interleaving.

Before a description of the methods for writing the coded bits, a method for determining whether to use the dummy bits will be described.

Whether to use the dummy bits is determined according to whether the total number U of the coded bits received from the encoder is a multiple of the total number C2 of columns constituting a buffer matrix for the use area. Here, the C2 can be previously determined according to a size of a buffer in the interleaver. Further, the total number R2 of rows, used to determine the use area, can be determined according to the total number U of the coded bits, as the C2 is previously determined. Therefore, the use area is determined by the product of the C2 and the R2 (C2×R2). In addition, whether to use the dummy bits can be determined by comparing the product of the C2 and the R2 with the U. For example, if a condition of U=C2×R2 is satisfied as the U is a multiple of the C2, then the dummy bits are not used. However, if a condition of U<C2×R2 is satisfied as the U is not a multiple (R2) of the C2, then the dummy bits are used.

2.2.1 No Dummy Bit Used

FIGS. 8A, 8B, 9A and 9B illustrate exemplary methods of writing coded bits in the interleaver 710 in the case where the dummy bits are not used. Specifically, FIGS. 8A and 8B illustrate a case where a code rate used by the encoder is ½, and FIGS. 9A and 9B illustrate a case where a code rate used by the encoder is ¾.

First, a description will be made of a case where systematic bits and parity bits are received in the same ratio, as the code rate of the encoder is ½.

FIG. 8A illustrates a method of writing the parity bits beginning at the end of the use area in the case where the code rate is ½, and FIG. 8B illustrates a method of writing the parity bits beginning at the head of the second write area of the use area in the case where the code rate is ½.

Referring to FIG. 8A, the use area, a part of the entire area for the buffer included in the interleaver 710, is determined depending on the total number U of coded bits received from the encoder. The use area is determined in such a matter that if no remainder exists after dividing the U by the predefined C2, a quotient obtained by the division is defined as the total number R2 of rows. However, if a remainder exists after the division, the R2 is determined by adding 1 to the quotient. The use area can be defined as the sum of a first write area and a second write area illustrated in FIG. 8A, and the first write area and the second write area are determined by equally dividing the use area into two areas. In the writing method of FIG. 8A, it is not necessary to physically definitely separate the first write area and the second write area. The reason is because the systematic bits out of the coded bits are written beginning at the head of the use area (represented by black arrows), while the parity bits among the coded bits are written beginning at the end of the use area (represented by white arrows). In other words, the systematic bits are written in a forward direction beginning at (0,0) of the use area, and the parity bits are written in a reverse direction beginning at (R2−1,C2−1) of the use area. Here, C2 represents the total number of columns constituting a buffer matrix in the use area, and R2 represents the total number of rows constituting the buffer matrix in the use area. Therefore, when the coded bits are completely written in the use area, the first write area and the second write area can be naturally separated by the coded bits written therein.

Referring to FIG. 8B, the use area, a part of the entire area for the buffer included in the interleaver 710, is determined depending on the total number U of coded bits received from the encoder. The use area can be defined as the sum of a first write area and a second write area illustrated in FIG. 8B, and the first write area and the second write area are determined by equally dividing the use area into two areas. After the first write area and the second write area are determined, the systematic bits out of the coded bits are written beginning at the head of the first write area (represented by black arrows), and the parity bits out of the coded bits are written beginning at the head of the second write area (represented by white arrows). In other words, the systematic bits are written in a forward direction beginning at (0,0) of the use area, and the parity bits are written in a forward direction beginning at (y,z) of the use area. Here, since the code rate is ½, y=R2/2 and z=0.

Next, a description will be made of a case where systematic bits and parity bits are received in a ratio of 3:1, as the code rate of the encoder is ¾.

FIG. 9A illustrates a method of writing the parity bits beginning at the end of the use area in the case where the code rate is ¾, and FIG. 9B illustrates a method of writing the parity bits beginning at the head of the second write area of the use area in the case where the code rate is ¾.

Referring to FIG. 9A, the use area, a part of the entire area for the buffer included in the interleaver 710, is determined depending on the total number U of coded bits received from the encoder. The use area is determined in such a matter that a quotient obtained by dividing the U by the predefined C2 is defined as R2. The use area can be defined as the sum of a first write area and a second write area illustrated in FIG. 9A. In the writing method of FIG. 9A, it is not necessary to physically definitely separate the first write area and the second write area. The reason is because the systematic bits out of the coded bits are written beginning at the head of the use area (represented by black arrows), while the parity bits out of the coded bits are written beginning at the end of the use area (represented by white arrows). In other words, the systematic bits are written in a forward direction beginning at (0,0) of the use area, and the parity bits are written in a reverse direction beginning at (R2−1,C2−1) of the use area. The systematic bits and the parity bits written in the use area are separated by a boundary point (y,z) between the first write area and the second write area. The (y,z), a boundary point between the first write area and the second write area, is a coordinate designating a particular point in the use area. If there exists a quotient or a remainder obtained by dividing the total number of systematic bits by the C2, the is defined as a value determined by adding 1 to the quotient, and the z becomes he remainder. Therefore, the first write area can be defined as an area from the (0,0) to the (y,z) of the use area, and the second write area can be defined as an area from the (y,z) to the (R2−1,C2−1) of the use area.

Referring to FIG. 9B, the use area, a part of the entire area for the buffer included in the interleaver 710, is determined depending on the total number U of coded bits received from the encoder. The use area can be defined as the sum of a first write area and a second write area illustrated in FIG. 9B. After the first write area and the second write area are determined, the systematic bits out of the coded bits are written beginning at the head of the first write area (represented by black arrows), and the parity bits out of the coded bits are written beginning at the head of the second write area, i.e., beginning at the (y,z) (represented by white arrows). In other words, the systematic bits are written in a forward direction beginning at (0,0) of the use area, and the parity bits are written in a forward direction beginning at (y,z) of the use area. As stated above, if there exists a quotient or a remainder obtained by dividing the total number of systematic bits by the C2, the y is defined as a value determined by adding 1 to the quotient, and the z becomes the remainder.

2.2.2 Dummy Bits Used

Although a method of writing the coded bits using the dummy bits will be described with reference to a code rate ¾, it would be obvious to those skilled in the art that the same method can be applied even to a code rate ½.

As defined above, the dummy bits are used when there remains an empty area even after the systematic bits and the parity bits are completely written in the use area. That is, the dummy bits are used when the U is not a multiple of the C2. A method of inserting the dummy bits is realized in different ways according to a position in the use area, where the dummy bits are to be inserted. FIGS. 10A to 10D illustrate methods of writing the coded bits according to a position of the dummy bits. The position of the dummy bits can be determined depending on a direction in which the parity bits are written in the second write area, and a write starting point of the parity bits.

Figure 10A:
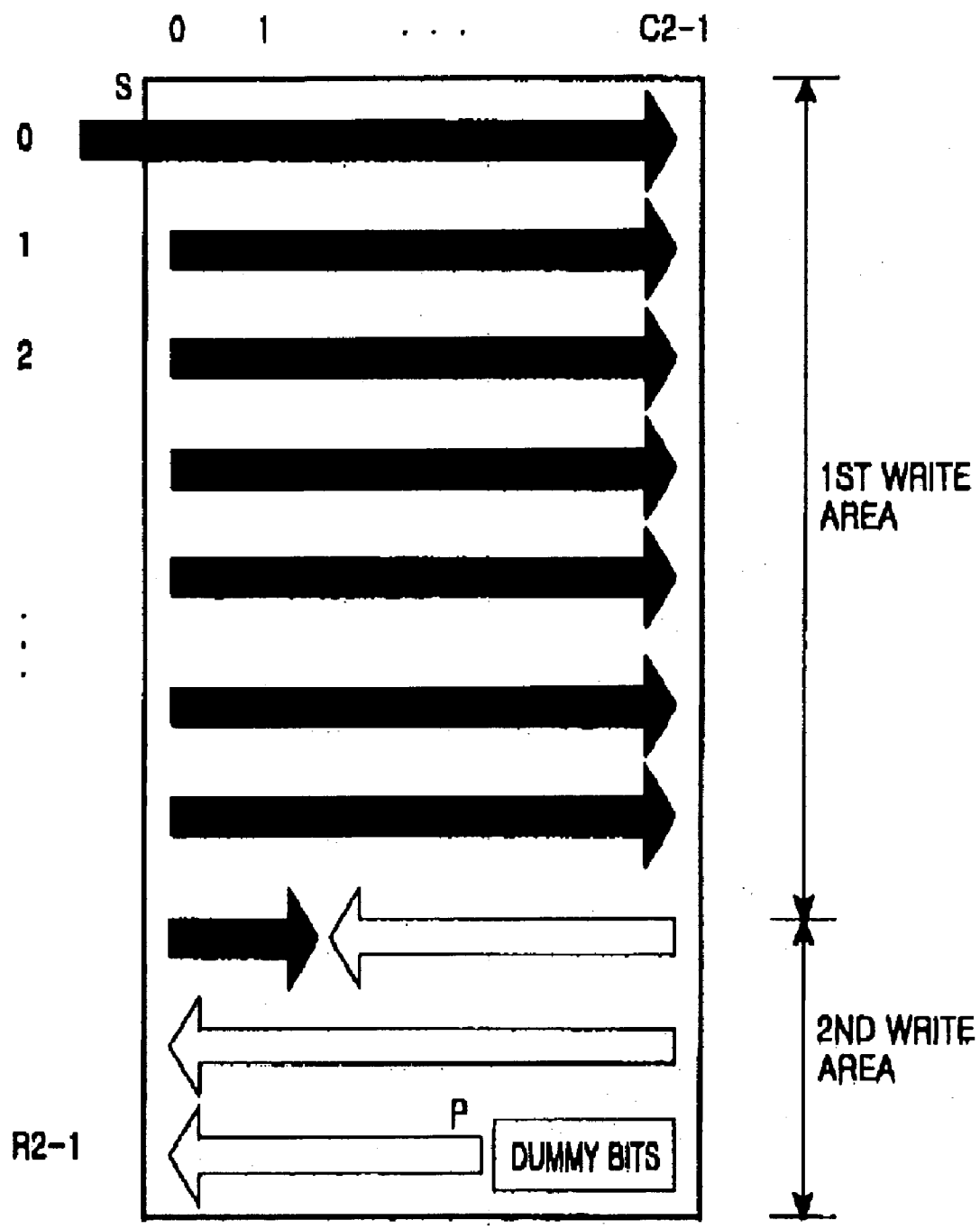
FIGS. 10A to 10D illustrate examples of a writing process for a code rate ¾, using dummy bits, according to the first embodiment of the present invention.
Figure 10B:
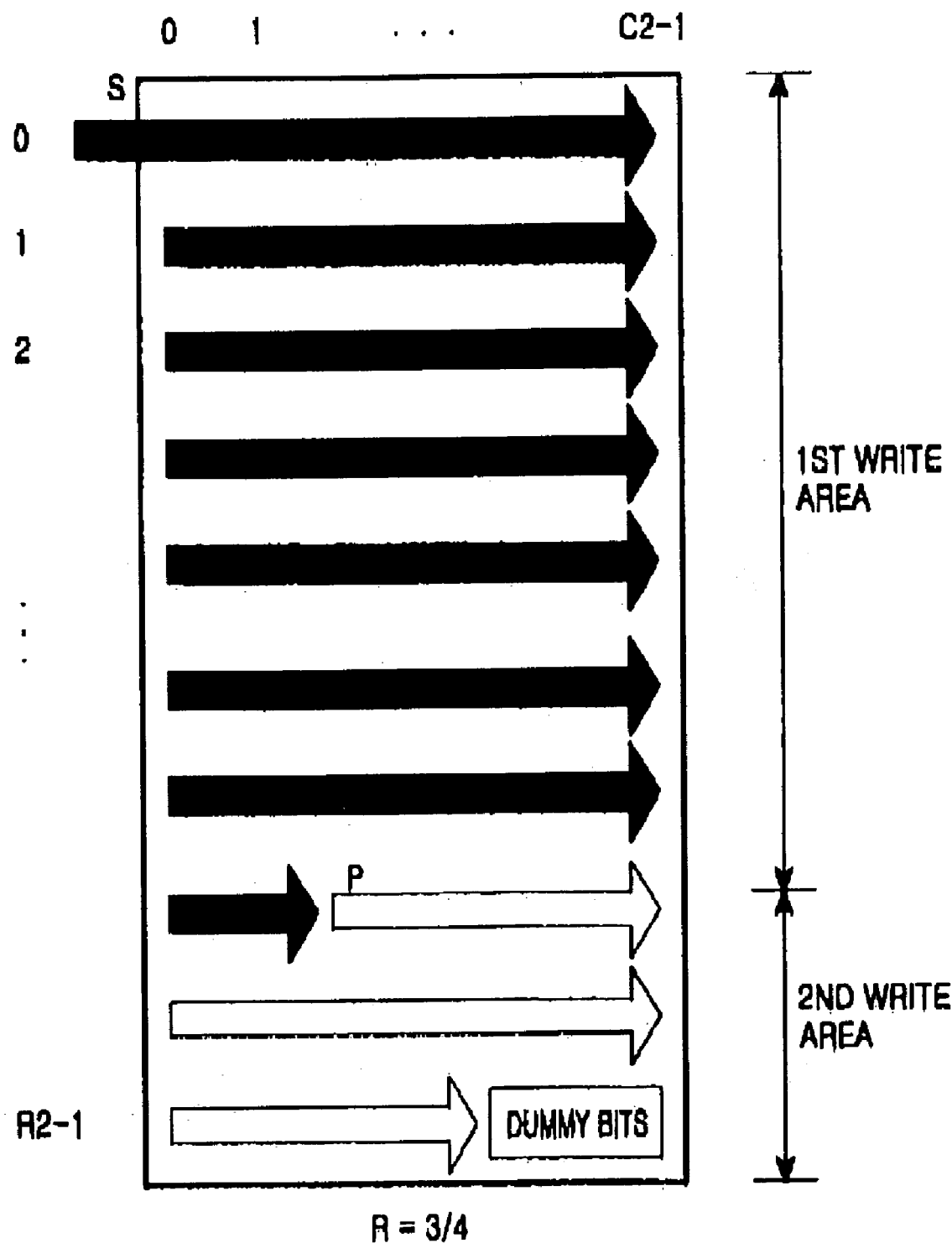
Figure 10C:
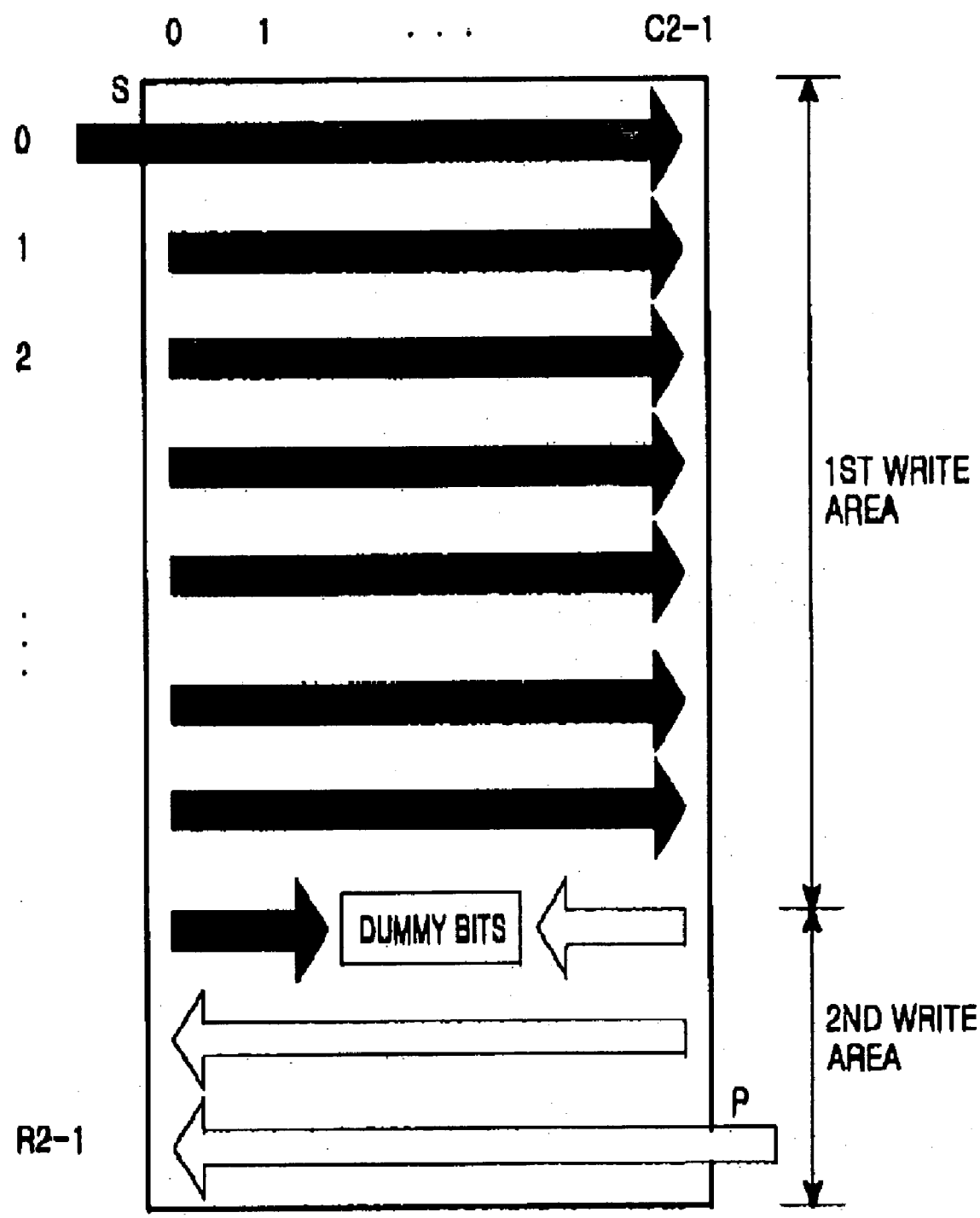
Figure 10D:
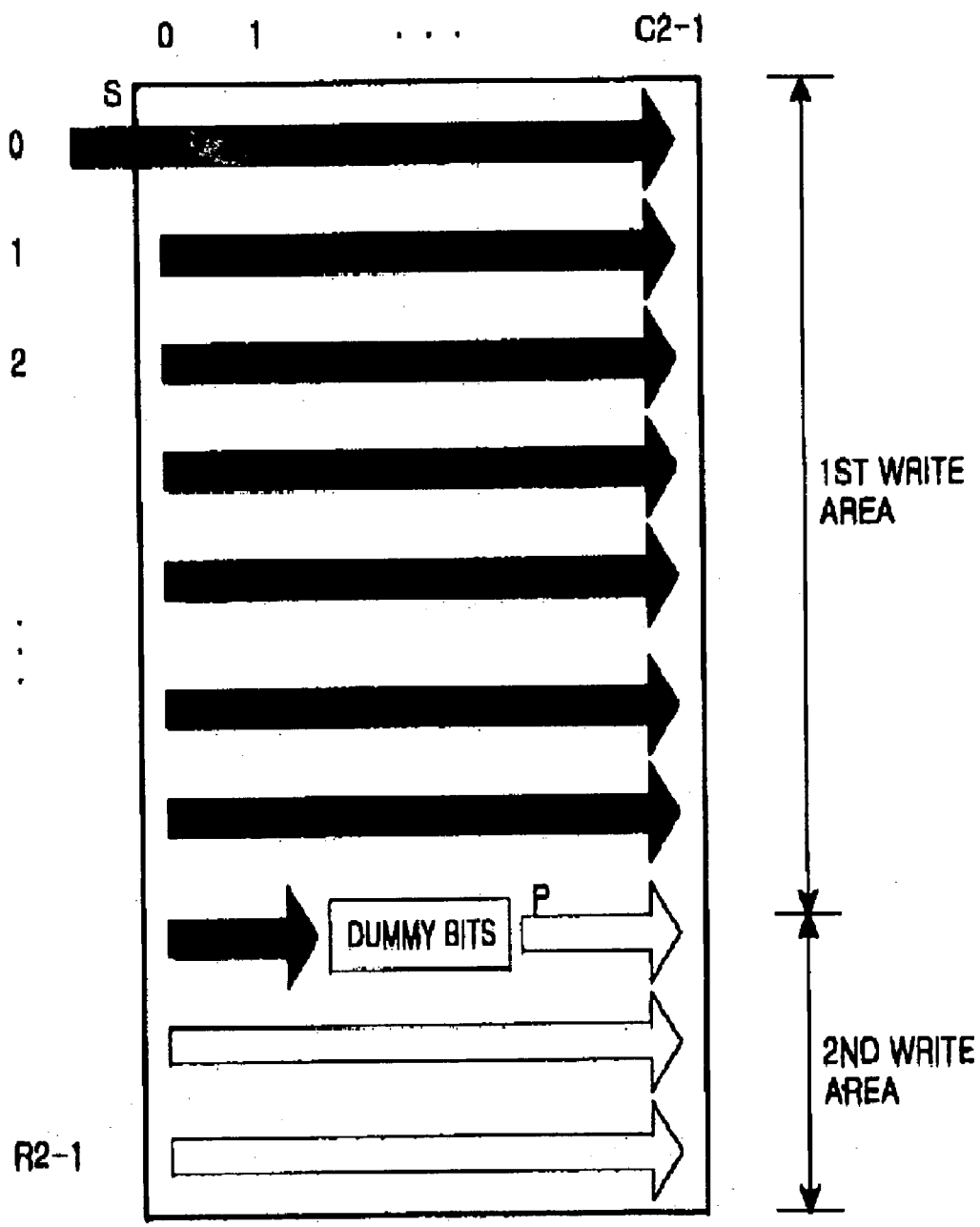

FIG. 10A illustrates a method of writing coded bits in the case where the dummy bits are written in a reverse direction and a point shifted from an end of the second write area by the dummy bits is defined as a starting point. FIG. 10B illustrates a method of writing coded bits in the case where the dummy bits are written in a forward direction and a head of the second write area is defined as a starting point. FIG. 10C illustrates a method of writing coded bits in the case where the dummy bits are written in a reverse direction and an end the second write area is defined as a starting point. FIG. 10D illustrates a method of writing coded bits in the case where the dummy bits are written in a forward direction and a point shifted from a head of the second write area by the dummy bits is defined as a starting point.

Referring to FIG. 10A, the use area, a part of the entire area for the buffer included in the interleaver 710, is determined depending on the total number U of coded bits received from the encoder. The use area can be defined as the sum of a first write area and a second write area illustrated in FIG. 10A. In the writing method of FIG. 10A where the dummy bits are located at the end of the second write area, it is not necessary to physically definitely separate the first write area and the second write area. The reason is because the systematic bits out of the coded bits are written beginning at the head of the use area (represented by black arrows), while the parity bits out of the coded bits are written beginning at the end of the use area (represented by white arrows). In other words, the systematic bits are written in a forward direction beginning at (0,0) of the use area, and the parity bits are written in a reverse direction beginning at (R2−1,x) of the use area. The x can be calculated by subtracting the number of the dummy bits from a column number corresponding to the C2−1. Therefore, as stated above, the systematic bits and the parity bits written in the use area are separated by a boundary point (y,z) between the first write area and the second write area.

Referring to FIG. 10B, the systematic bits are written in the same way as described in the above methods. However, the parity bits are written in a forward direction beginning at a boundary (y,z) between the first write area and the second write area. Here, the (y,z) can be newly defined taking into account the dummy bits to be inserted. After the parity bits are completely written, the dummy bits are inserted in a remaining area existing at the end of the second write area.

Referring to FIG. 10C, the systematic bits are written in a forward direction beginning at the head of the first write area, and the parity bits are written in a reverse direction beginning at the end of the second write area. Thereafter, the dummy bits are inserted in an area left over after the systematic bits are written and an area left over after the parity bits are written.

Referring to FIG. 10D, the systematic bits are written in a forward direction beginning at the head of the first write area, and the parity bits are written in a forward direction beginning at an end of an area between a point where writing of the systematic bits is expected to be completed and a point where the dummy bits are to be inserted. Therefore, the dummy bits are inserted in a part of the first write area and a part of the second write area.

2.3 Reading of Coded Bits

The use area of a buffer in the interleaver 710, in which the coded bits are written, is separated into two virtual read areas for reading. The two read areas can be separated by equally dividing the use area into two areas with the same size. The interleaver 710 reads the coded bits written in the separated first read area and second read area.

FIGS. 11A and 11B illustrate exemplary methods of reading coded bits from the first read area and the second read area by the interleaver 710. Specifically, FIG. 11A illustrates a method of reading the coded bits written at a code rate ½, and FIG. 11B illustrates a method of reading the coded bits written at a code rate ¾.

Referring to FIGS. 11A and 11B, the interleaver 710 sequentially reads coded bits written in the first read area column by column. In addition, the interleaver 710 sequentially reads coded bits written in the second read area as well, column by column. As a result, in the case of FIG. 11A, only the systematic bits are read from the first read area and only the parity bits are read from the second read area. However, in the case of FIG. 11B, only the systematic bits are read from the first read area, and the systematic bits and the parity bits are read from second read area.

2.4 Operation of Transmitter According to First Embodiment

Figure 12:
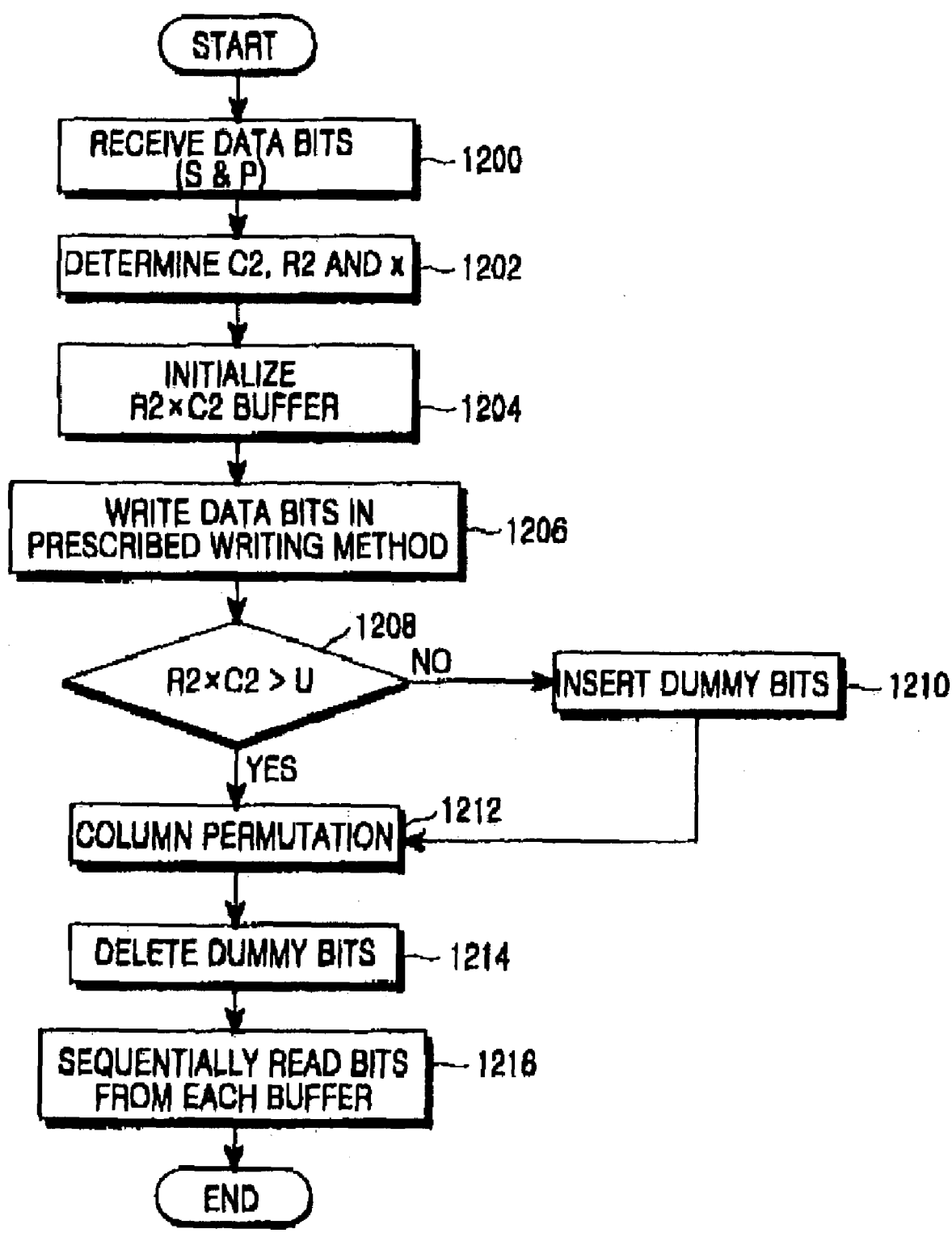
FIG. 12 is a flowchart illustrating a process of applying an SMP technique by logically separating an interleaver according to the first embodiment of the present invention.

FIG. 12 is a flowchart illustrating an interleaving process according to the first embodiment of the present invention. That is, FIG. 12 illustrates a modified interleaving algorithm for separately writing and reading systematic bits and parity bits. It will be assumed herein that the writing operation is performed in the manner described in conjunction with FIG. 10A, for convenience.

Referring to FIG. 12, the interleaver receives U coded bits from an encoder (Step 1200). The coded bits are represented by $u_{p,1}, u_{p,2}, u_{p,3}, \ldots, u_{p,Us}$, and $u_{p,Us+1}, u_{p,Us+2}, u_{p,Us+3}, \ldots, u_{p,Us+Up}$. Here, p represents a physical channel number, and Us and Up represent the number of systematic bits and the number of parity bits, respectively. The sum of the Us and Up is equal to the number of bits per frame of one physical channel.

(1) First, the total number of columns C2 is set to 30. The columns are assigned column numbers 0, 1, 2, . . . , C2−1 from left to right. The minimum integer indicating a row of a matrix R2, satisfying a condition of U=Us+Up≦R2×C2, is determined (Step 1202). The rows of the matrix are assigned row numbers 0, 1, 2, . . . , R2−1 from top to bottom (Step 1204).

(2) The inputs $u_{p,1}, u_{p,2}, u_{p,3}, \ldots, u_{p,Us}$ are written in a forward direction row by row in an R2×C2 rectangular matrix beginning at $y_{p,1}$ in a $0^{th}$ row and a $0^{th}$ column, and the inputs $u_{p,Us+1}, u_{p,Us+2}, u_{p,US+3}, \ldots, u_{p,Us+Up}$ are written in a reverse direction row by row beginning at a point in an $(R2-1)^{th}$ row and a $(x-1)^{th}$ column (Step 1206). Here, x means a remainder obtained by dividing the U by the C2, and is larger than or equal to 1 and smaller than C2 (1≦x<C2). Equation (3) shows an example of the matrix generated in this manner.

$$\begin{bmatrix} y_{p,1} & y_{p,2} & y_{p,3} & \cdots & y_{p,C2} \\ y_{p,(C2+1)} & y_{p,(C2+2)} & y_{p,(C2+3)} & \cdots & y_{p,(2\times C2)} \\ \vdots & \vdots & \vdots & \cdots & \vdots \\ y_{p,((R2-1)\times C2+1)} & y_{p,((R2-1)\times C2+2)} & y_{p,((R2-1)\times C2+3)} & \cdots & y_{p,(R2\times C2)} \end{bmatrix}$$

Equation (3)

Here, $y_{p,k}=u_{p,k}$ for k=1,2, . . . , U. If R2×C2>U (Step 1208), then dummy bits of $Y_{p,k}=0$ or 1 (for k=U+1, U+2, . . . , R2×C2) are inserted (Step 1210). The dummy bits are deleted (Step 1214) after being subject to column permutation (Step 1212).

(3) After the column permutation is performed according to a rule (Step 1212), the resulting bits are divided into an H part with higher reliability and an L part with lower reliability, and expressed with $y_{p,k}^H$ and $y_{p,k}^L$, as follows.

$$\begin{bmatrix} y_{p,1}^H & y_{p,(R2/2+1)}^H & y_{p,R2+1}^H & \cdots & y_{p,((C2-1)\times R2/2+1)}^H \\ y_{p,2}^H & y_{p,(R2/2+2)}^H & y_{p,R2+2}^H & \cdots & y_{p,((C2-1)\times R2/2+2)}^H \\ \vdots & \vdots & \vdots & \cdots & \vdots \\ y_{p,R2/2}^H & y_{p,R2}^H & y_{p,3\times R2/2}^H & \cdots & y_{p,(C2\times R2/2)}^H \\ y_{p,1}^L & y_{p,(R2/2+1)}^L & y_{p,R2+1}^L & \cdots & y_{p,((C2-1)\times R2/2+1)}^L \\ y_{p,2}^L & y_{p,(R2/2+2)}^L & y_{p,R2+2}^L & \cdots & y_{p,((C2-1)\times R2/2+2)}^L \\ \vdots & \vdots & \vdots & \cdots & \vdots \\ y_{p,R2/2}^L & y_{p,R2}^L & y_{p,3\times R2/2}^L & \cdots & y_{p,(C2\times R2/2)}^L \end{bmatrix}$$

Equation (4)

(4) Outputs of the block interleaver are read by two bits column by column by equally dividing the column-permuted R2×C2 matrix into a part with higher reliability and a part with lower reliability (Step 1216). The outputs are represented by $v_{p,1}, v_{p,2}, v_{p,3}, \ldots, v_{p,Us}$.

3. Second Embodiment of Logical Separation Method

Figure 13:
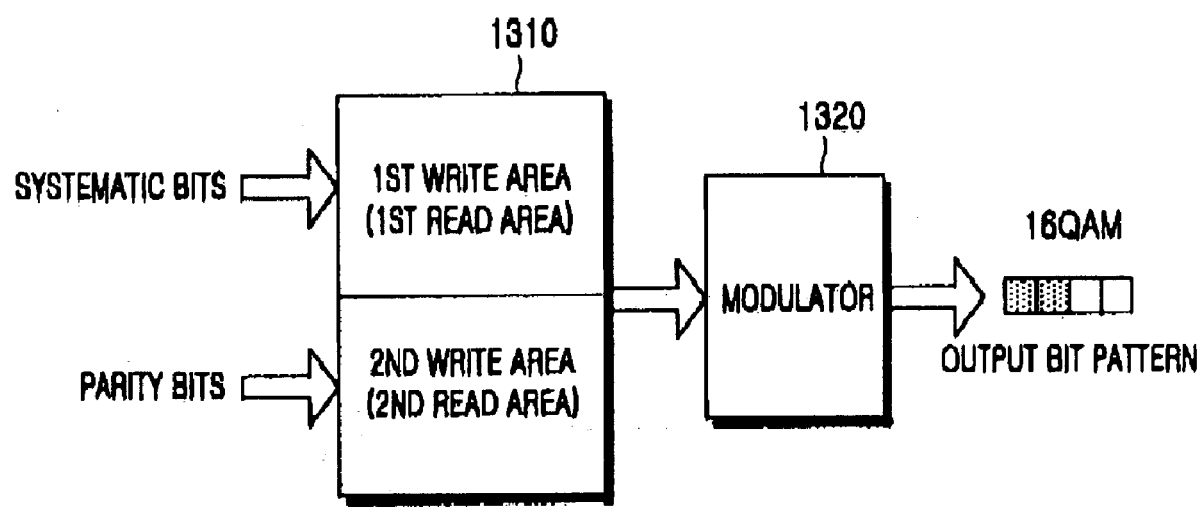
FIG. 13 is a block diagram illustrating a structure of a transmitter according to a second embodiment of the present invention.

FIG. 13 illustrates a structure of a transmitter for realizing the SMP technique by logically separating a buffer included in one interleaver according to a second embodiment of the present invention.

Referring to FIG. 13, an interleaver 1310 includes a buffer having a prescribed area therein. The prescribed area of the buffer defines a use area determined by the total number of coded bits received from an encoder (not shown). The interleaver 1310 divides the use area into a first write area and a second write area according to a ratio of systematic bits to parity bits, constituting the coded bits. Here, the ratio of the systematic bits to the parity bits is determined depending on a code rate used by the encoder. It is assumed in FIG. 13 that the interleaver 1310 is designed to support a code rate ½.

Upon receiving coded bits from the encoder, the interleaver 1310 sequentially writes the systematic bits among the coded bits in the first write area, and sequentially writes the parity bits in the second write area. Here, the interleaver 1310 inserts dummy bits into an area left over after writing the systematic bits in the first write area, and inserts the dummy bits into an area left over after writing the parity bits in the second write area.

Figure 14A:
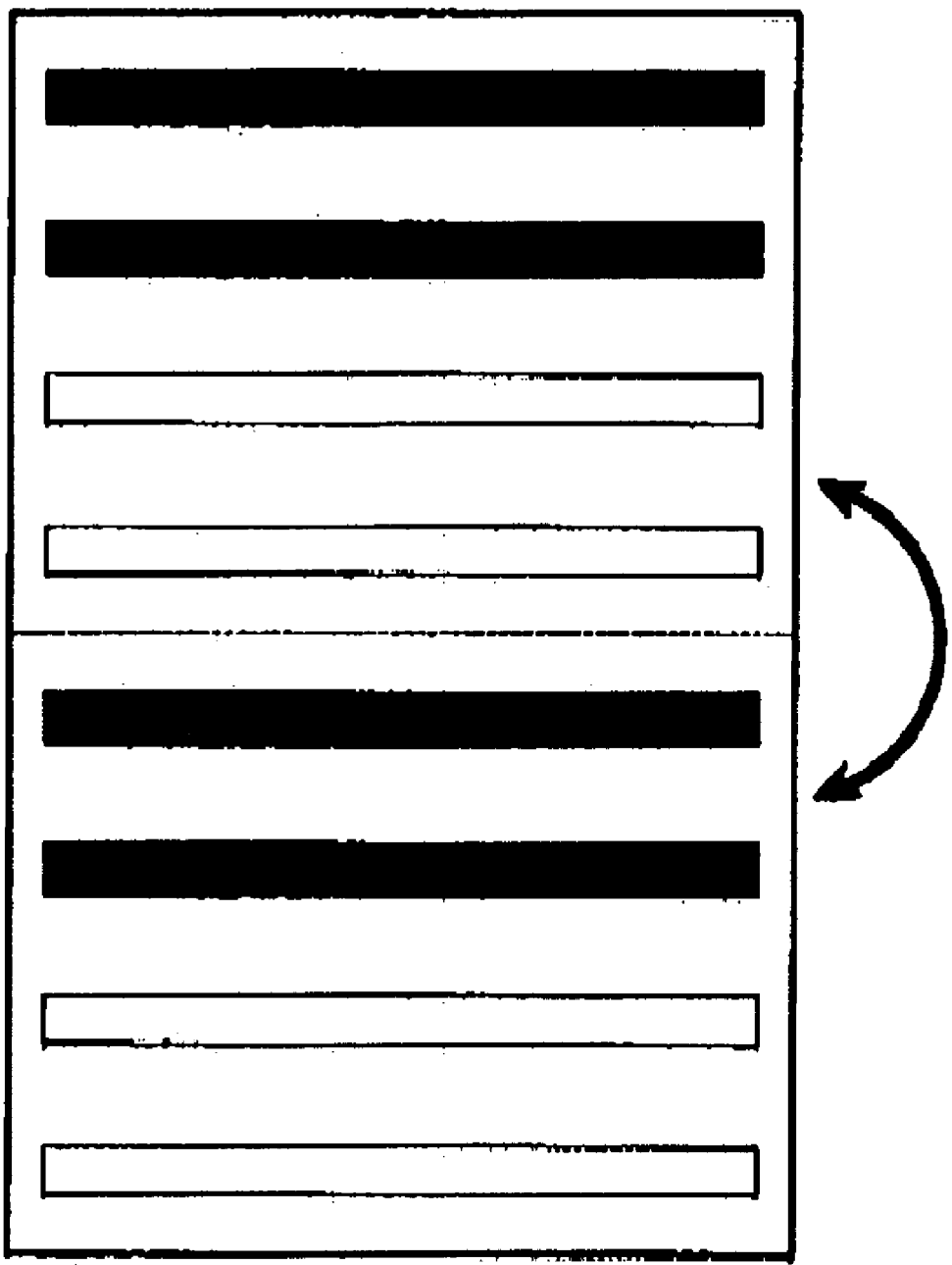
FIGS. 14A and 14B illustrate examples of a writing process according to the second embodiment of the present invention.
Figure 14B:
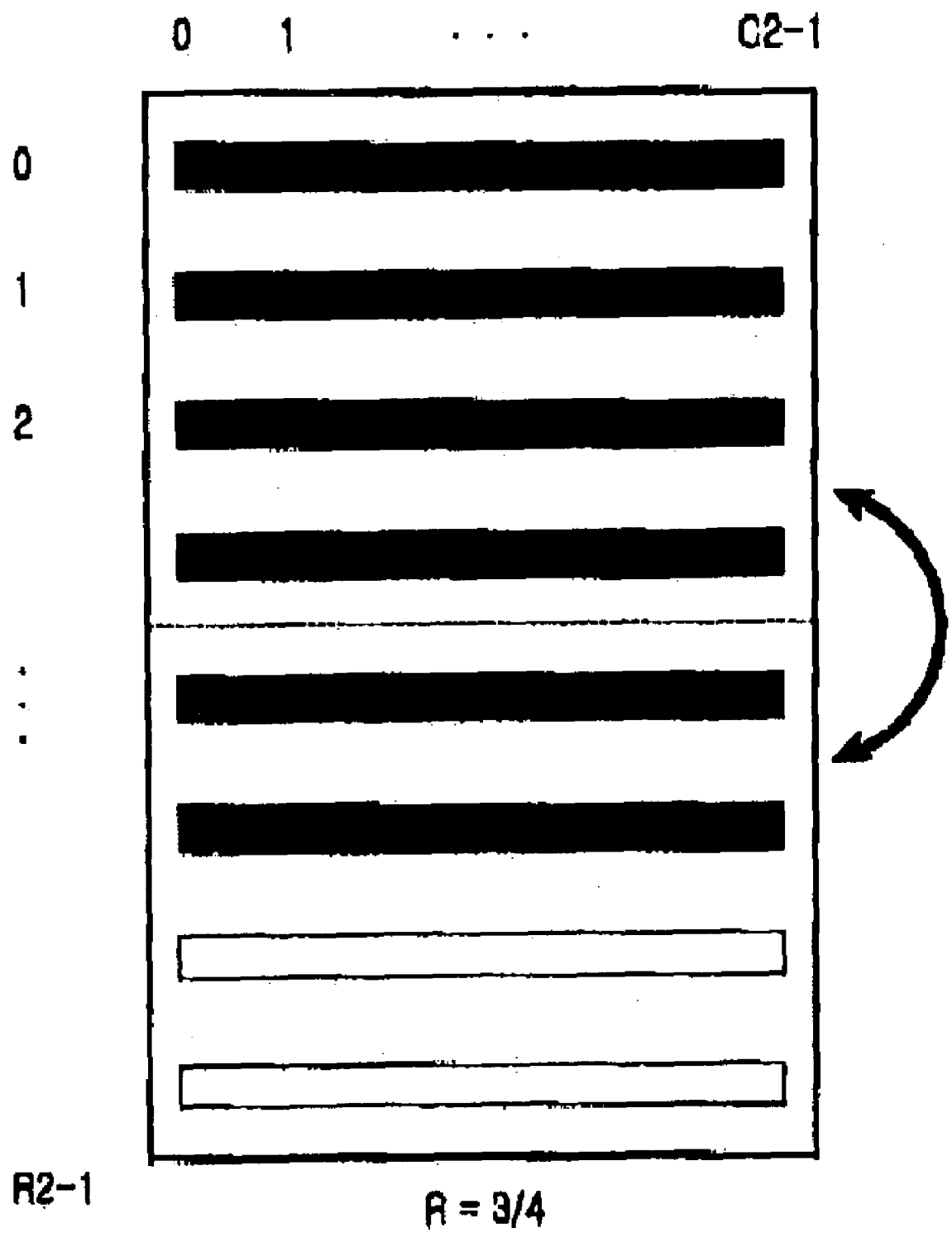

After completion of writing the systematic bits and the parity bits in this manner, the interleaver 1310 interleaves the coded bits including the dummy bits stored in the use area through column permutation. The column permutation permutes the coded bits in the use area column by column, so that the written systematic bits are never mixed with the written parity bits. After the column permutation, the interleaver 1310 permutes lower half columns among rows constituting the first write area with upper half columns among rows constituting the second write area. As a result, the coded bits written in the first write area and the second write area can be properly read in the form of a bit stream according to the SMP technique. Examples of the inter-row permutation (or row permutation) are illustrated in FIGS. 14A and 14B. Specifically, FIG. 14A illustrates row permutation for a code rate ½, and FIG. 14B illustrates row permutation for a code rate ¾.

Figure 15A:
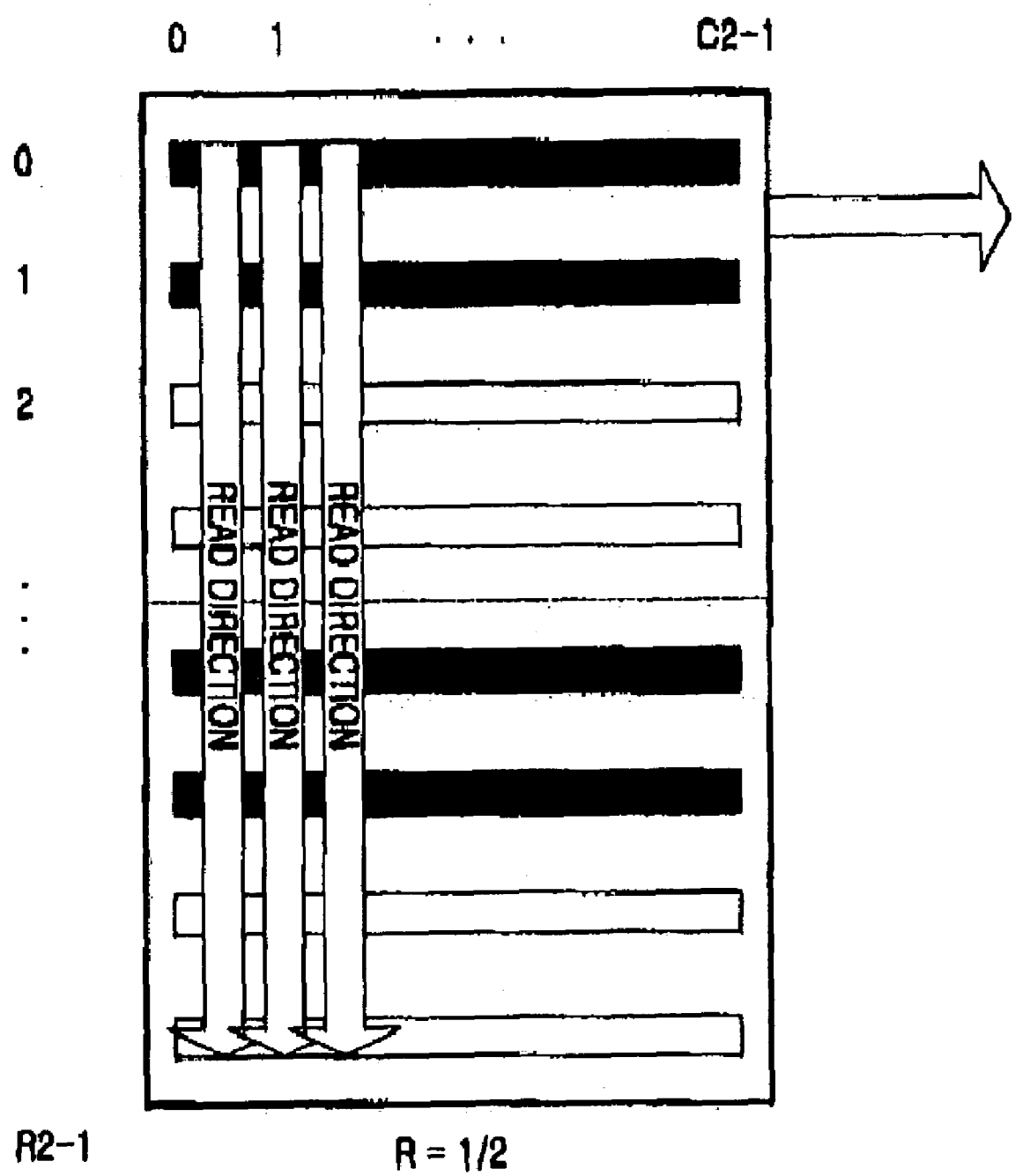
FIGS. 15A and 15B illustrate examples of a read process according to the second embodiment of the present invention.
Figure 15B:
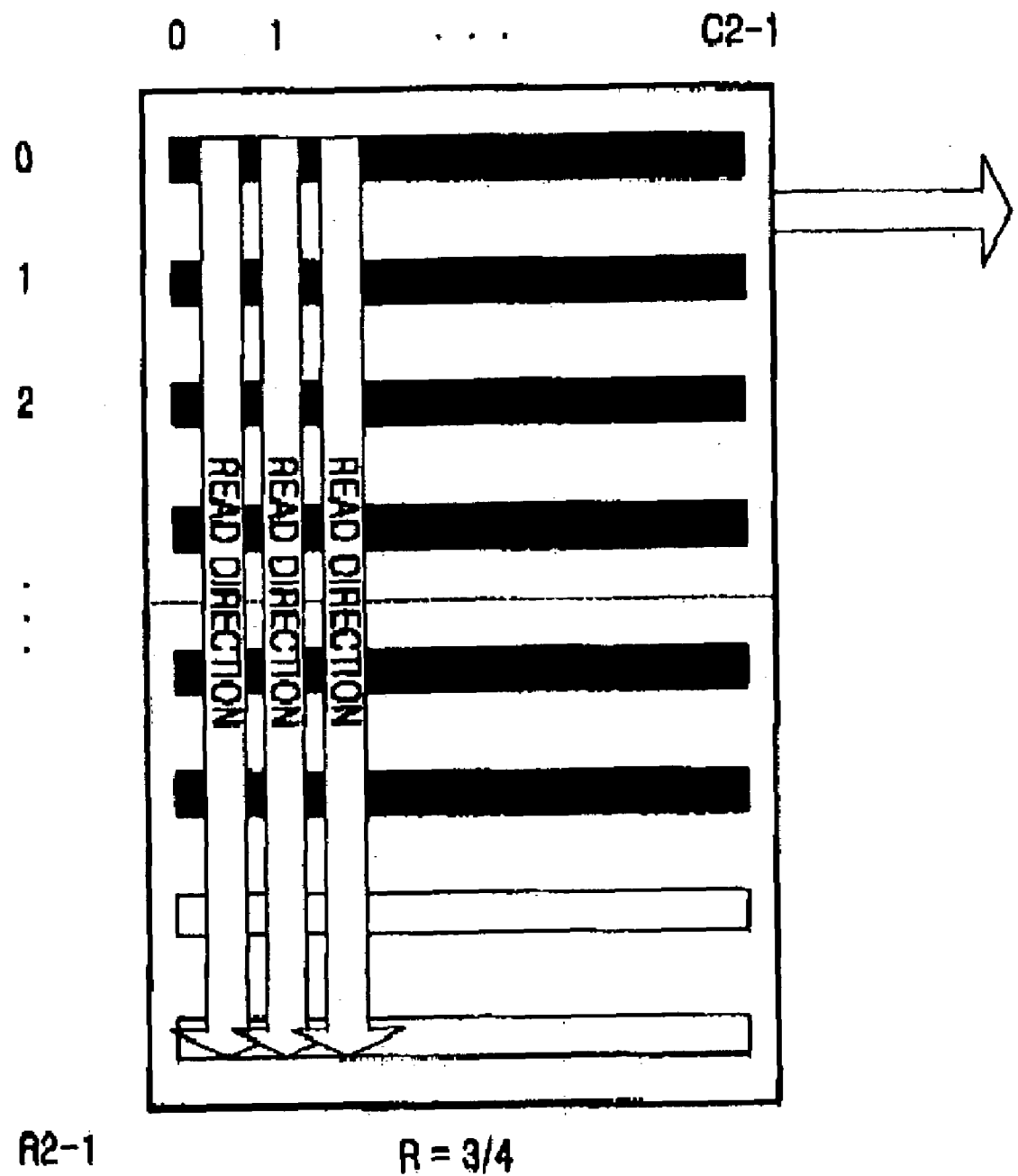

Thereafter, the interleaver 1310 sequentially reads the written coded bits. Exemplary methods of reading the coded bits by the interleaver 1310 are illustrated in FIGS. 15A and 15B. Specifically, FIG. 15A illustrates a method for reading the coded bits in the case where the code rate ½ is used, and FIG. 15B illustrates a method for reading the coded bits in the case where the code rate ¾ is used.

Herein, the column permutation operation and the reading operation for interleaving have been separately described. However, it would be obvious to those skilled in the art that the column permutation operation and the reading operation can be united into one operation by changing the order of reading.

As stated above, the coded bits read by the interleaver 1310 have a format required for applying the SMP technique. Therefore, the coded bits output from the interleaver 1310 are provided to a modulator 1320, where they are subject to symbol mapping by the SMP technique.

As described above, the present invention interleaves systematic bits and parity bits by logically separating one interleaver so that a modulator can perform symbol mapping by the SMP technique. Further, in order to exclude the MUX used in the first embodiment, it is necessary to modify a Re199 reading algorithm. That is, the MUX can be excluded, if the algorithm is changed such that the coded bits written in the two write areas should be read by two bits. In other words, in the case of logically separated interleaving buffers, it is possible to exclude a hardware device for the MUX by simply modifying the reading algorithm in the above-stated manner. A novel algorithm which will be described herein below includes modification of the reading algorithm. In addition, in the case where R2 of a buffer matrix is a multiple of 4, it is possible to realize the existing reading algorithm for reading the entire buffer in the interleaver, through row permutation in stead of using the MUX.

FIGS. 15A and 15B illustrate symbol patterns of a modulator based on the row permutation, for the code rates ½ and ¾, respectively. Referring to FIGS. 15A and 15B, both patterns do not violate an idea of the SMP technique that differentially maps reliabilities according to priority. When an extended amount of actual data is applied, it is possible to obtain the same result as the result obtained by the first embodiment.

Figure 16:
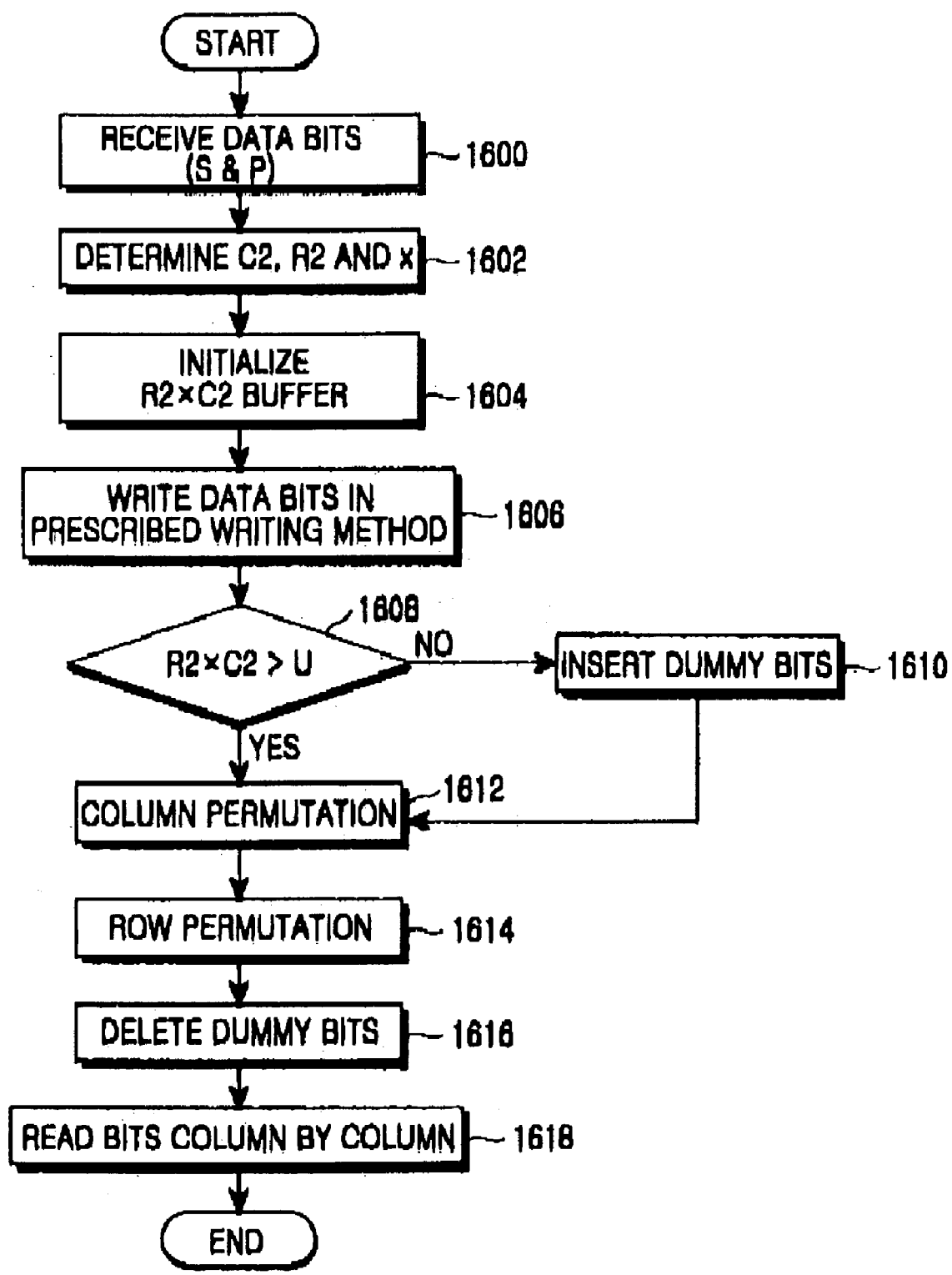
FIG. 16 is a flowchart illustrating a process of applying an SMP technique by logically separating an interleaver according to the second embodiment of the present invention.

FIG. 16 is a flowchart illustrating an interleaving process according to the second embodiment of the present invention. Referring to FIG. 16, a block interleaver with a column permutation function is used for interleaving. The interleaver receives $u_{p,1}, u_{p,2}, u_{p,3}, \ldots, u_{p,Us}$, and $u_{p,Us+1}, u_{p,Us+2}, u_{p,Us+3}, \ldots, u_{p,Us+Up}$ (Step 1600). Here, p represents a physical channel number, and Us and Up represent the number of systematic bits and the number of parity bits, respectively. The sum of the Us and Up is equal to the number of bits per frame of one physical channel.

(1) First, the total number of columns C2 is set to 30. The columns are assigned column numbers $0, 1, 2, \ldots, C2-1$ from left to right. The minimum integer indicating a row of a matrix R2, satisfying a condition of $U=Us+Up \leq R2 \times C2$, is determined (Step 1602). The rows of the matrix are assigned row numbers $0, 1, 2, \ldots, R2-1$ from top to bottom (Step 1604).

(2) The inputs $u_{p,1}, u_{p,2}, u_{p,3}, \ldots, u_{p,Us}$ are written in a forward direction row by row in an R2×C2 rectangular matrix beginning at $y_{p,1}$ in a $0^{th}$ row and a $0^{th}$ column, and the inputs $u_{p,Us+1}, u_{p,Us+2}, u_{p,Us+3}, \ldots, u_{p,Us+Up}$ are written in a reverse direction row by row beginning at a point in an $(R2-1)^{th}$ row and a $(x-1)^{th}$ column (Step 1606). Here, x means a remainder obtained by dividing the U by the C2, and is larger than or equal to 1 and smaller than C2 ($1 \leq x < C2$). Equation (5) shows an example of the matrix generated in this manner.

$$\begin{bmatrix} y_{p,1} & y_{p,2} & y_{p,3} & \cdots & y_{p,C2} \\ y_{p,(C2+1)} & y_{p,(C2+2)} & y_{p,(C2+3)} & \cdots & y_{p,(2 \times C2)} \\ \vdots & \vdots & \vdots & \cdots & \vdots \\ y_{p,((R2-1) \times C2+1)} & y_{p,((R2-1) \times C2+2)} & y_{p,((R2-1) \times C2+3)} & \cdots & y_{p,(R2 \times C2)} \end{bmatrix} \quad \text{Equation (5)}$$

Here, $y_{p,k} = u_{p,k}$ for $k=1, 2, \ldots, U$. If $R2 \times C2 > U$ (Step 1608), then dummy bits of $y_{p,k}=0$ or 1 (for $k=U+1, U+2, \ldots, R2 \times C2$) are inserted (Step 1610).

(3) After the column permutation is performed according to a rule (Step 1612), the resulting bits are divided into an H part with higher reliability and an L part with lower reliability, and expressed with $y_{p,k}^H$ and $y_{p,k}^L$, as follows.

$$\begin{bmatrix} y_{p,1}^H & y_{p,(R2/2+1)}^H & y_{p,R2+1}^H & \cdots & y_{p,((C2-1)\times R2/2+1)}^H \\ y_{p,2}^H & y_{p,(R2/2+2)}^H & y_{p,R2+2}^H & \cdots & y_{p,((C2-1)\times R2/2+2)}^H \\ \vdots & \vdots & \vdots & \cdots & \vdots \\ y_{p,R2/2}^H & y_{p,R2}^H & y_{p,3\times R2/2}^H & \cdots & y_{p,(C2\times R2/2)}^H \\ y_{p,1}^L & y_{p,(R2/2+1)}^L & y_{p,R2+1}^L & \cdots & y_{p,((C2-1)\times R2/2+1)}^L \\ y_{p,2}^L & y_{p,(R2/2+2)}^L & y_{p,R2+2}^L & \cdots & y_{p,((C2-1)\times R2/2+2)}^L \\ \vdots & \vdots & \vdots & \cdots & \vdots \\ y_{p,R2/2}^L & y_{p,R2}^L & y_{p,3\times R2/2}^L & \cdots & y_{p,(C2\times R2/2)}^L \end{bmatrix}$$ Equation (6)

(4) Rows with lower reliability are permuted with rows with higher reliability so that rows with higher reliability bits and rows with lower reliability bits should be repeated by two rows, as follows (Step 1614). The dummy bits are deleted (Step 1616) after being subject to row column permutation (Step 1614).

$$\begin{bmatrix} y_{p,1}^H & y_{p,(R2/2+1)}^H & y_{p,R2+1}^H & \cdots & y_{p,((C2-1)\times R2/2+1)}^H \\ y_{p,2}^H & y_{p,(R2/2+2)}^H & y_{p,R2+2}^H & \cdots & y_{p,((C2-1)\times R2/2+2)}^H \\ y_{p,1}^L & y_{p,(R2/2+1)}^L & y_{p,R2+1}^L & \cdots & y_{p,((C2-1)\times R2/2+1)}^L \\ y_{p,2}^L & y_{p,(R2/2+2)}^L & y_{p,R2+2}^L & \cdots & y_{p,((C2-1)\times R2/2+2)}^L \\ \vdots & \vdots & \vdots & \cdots & \vdots \\ y_{p,R2/2-1}^H & y_{p,R2-1}^H & y_{p,3\times R2/2-1}^H & \cdots & y_{p,(C2\times R2/2-1)}^H \\ y_{p,R2/2}^H & y_{p,R2}^H & y_{p,3\times R2/2}^H & \cdots & y_{p,(C2\times R2/2)}^H \\ y_{p,R2/2-1}^L & y_{p,R2-1}^L & y_{p,3\times R2/2-1}^L & \cdots & y_{p,(C2\times R2/2-1)}^L \\ y_{p,R2/2}^L & y_{p,R2}^L & y_{p,3\times R2/2}^L & \cdots & y_{p,(C2\times R2/2)}^L \end{bmatrix}$$ Equation (7)

(5) Outputs of the block interleaver are read column by column from the column-permuted, row-permuted R2×C2 matrix (Step 1618). The outputs are represented by $v_{p,1}, v_{p,2}, v_{p,3}, \ldots, v_{p,Us}$.

3. Receiver According to Invention

Now, a description will be made of a receiver corresponding to the transmitter that realizes the SMP technique by logically separating a buffer included in one interleaver. The receiver has a symmetrical structure of the transmitter illustrated in FIG. 2. A deinterleaver for the receiver is illustrated in FIGS. 17 and 18.

Since a received signal is in the form of a symbol modulated by a modulator in the transmitter, the received signal is first demodulated by a demodulator and then provided to a deinterleaver. The deinterleaver has a symmetrical structure of the interleaver illustrated in FIG. 2. The serial input bits must be converted to parallel bits, so that they can be written in upper and lower areas of the interleaving buffer. The logically separated buffers perform deinterleaving in a reverse operation of the interleaver, and a distributor distributes the output bits into systematic bits and parity bits. A rate matcher determines positions of the bits rate-matched by the transmitter and inserts 0's in the determined positions, so that other bits can be applied to a proper input terminal of the demodulator. The demodulator, a device for decoding the bits encoded by an encoder in the transmitter, corrects errors occurring on a channel. The error-corrected output undergoes CRC checking by a CRC checker in order to determine whether the transmitted signal is correctly received. If an error is detected, the receiver sends a retransmission request to the transmitter. Since a high-speed packet transmission system uses various modulation orders and code rates, each element is controlled by a controller.

3.1 Structure of Receiver According to First Embodiment

Figure 17:
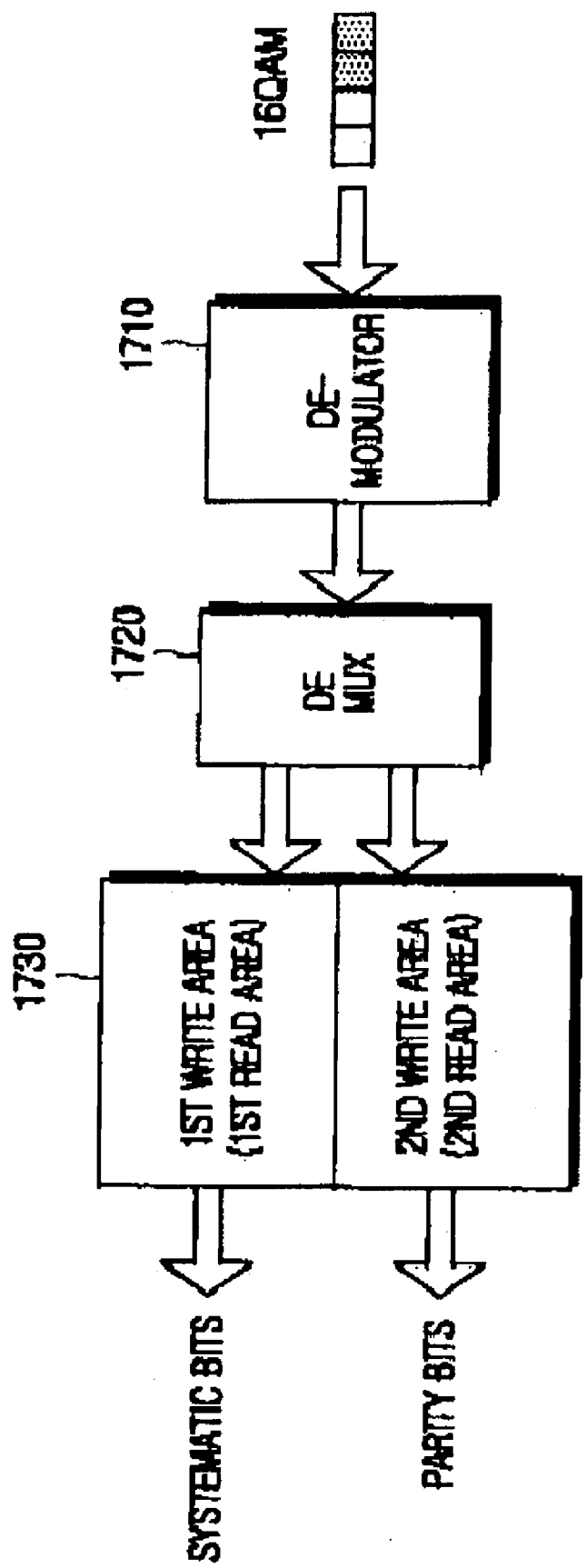
FIG. 17 is a block diagram illustrating a structure of a receiver corresponding to the transmitter according to the first embodiment of the present invention.
Figure 18:
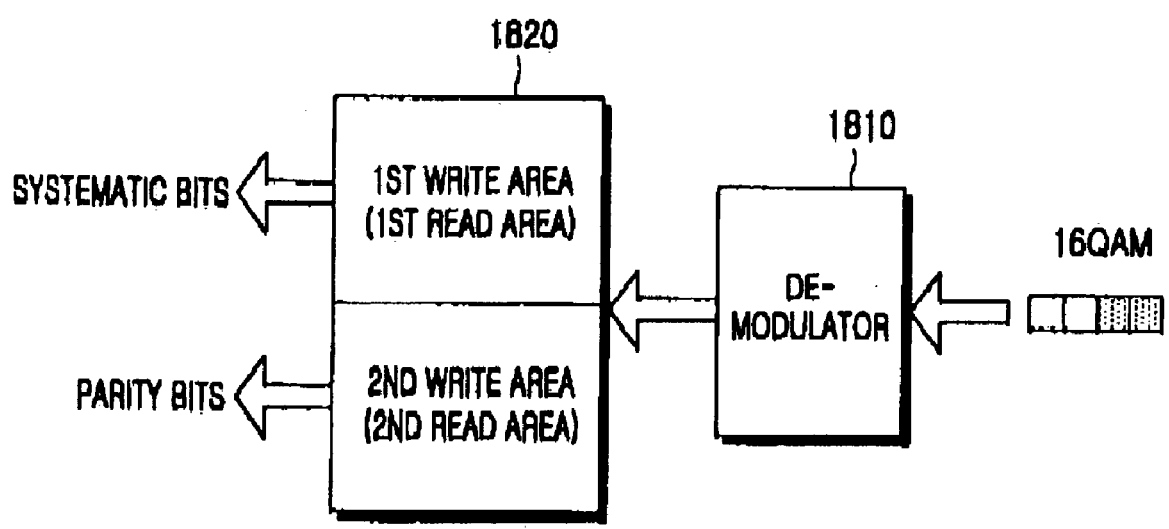
FIG. 18 is a block diagram illustrating a structure of a receiver corresponding to the transmitter according to the second embodiment of the present invention.

FIG. 17 illustrates a structure of a receiver according to a first embodiment of the present invention. The receiver corresponds to the transmitter described in conjunction with FIG. 7.

Referring to FIG. 17, data bits decoded by a demodulator 1710 are demultiplexed by a demultiplexer (DEMUX) 1720. The DEMUX 1720 demultiplexes as many input bits as a prescribed number according to a modulation technique, and provides the demultiplexed bits to a first write area and a second write area in a buffer 1730 of the deinterleaver. For example, if the modulation technique is 16QAM, the DEMUX 1720 provides the input bits by 2 bits to each of the first and second write areas in the buffer 1730. However, if the modulation technique is 64QAM, the DEMUX 1720 provides the input bits by 3 bits to each of the first and second write areas.

If the code rate is ½, systematic bits and parity bits are separately provided to the first and second write areas. However, if the code rate is ¾, only the systematic bits are provided to the first write area, and the systematic bits and parity bits are provided to the second write area.

The data bits written in the buffer 1730 of the deinterleaver are deinterleaved in a reverse operation of the interleaver, separately generating the systematic bits and the parity bits.

3.2 Structure of Receiver According to Second Embodiment

FIG. 18 illustrates a structure of a receiver according to the second embodiment of the present invention. The receiver corresponds to the transmitter described in conjunction with FIG. 13.

Referring to FIG. 18, data bits decoded by a demodulator 1810 are provided to a first write area and a second write area in a buffer 1820 of the deinterleaver, without being demultiplexed by a demultiplexer. As described in conjunction with FIG. 13, since the coded bits stored in the buffer 1310 are subject to row permutation in the interleaving process, the transmitter performs multiplexing though a prescribed reading method, without a multiplexer. Likewise, the receiver also can perform deinterleaving without a demultiplexing process, by performing row permutation on the received bits.

For example, if the modulation technique is 16QAM, the bits written in the buffer 1820 undergo row permutation by two rows between the first write area and the second write area. However, if the modulation technique is 64QAM, the bits written in the buffer 1820 undergo row permutation by three rows between the first write area and the second write area.

The data bits written in the buffer 1820 of the deinterleaver are deinterleaved in a reverse operation of the interleaver, separately generating the systematic bits and the parity bits.

When the interleaver is logically separated, the deinterleaver has the structures illustrated in FIGS. 17 and 18, based on a deinterleaving algorithm proposed by the present invention. The deinterleaving algorithm is illustrated in FIG. 19.

3.3 Operation of Receiver According to Invention

Figure 19:
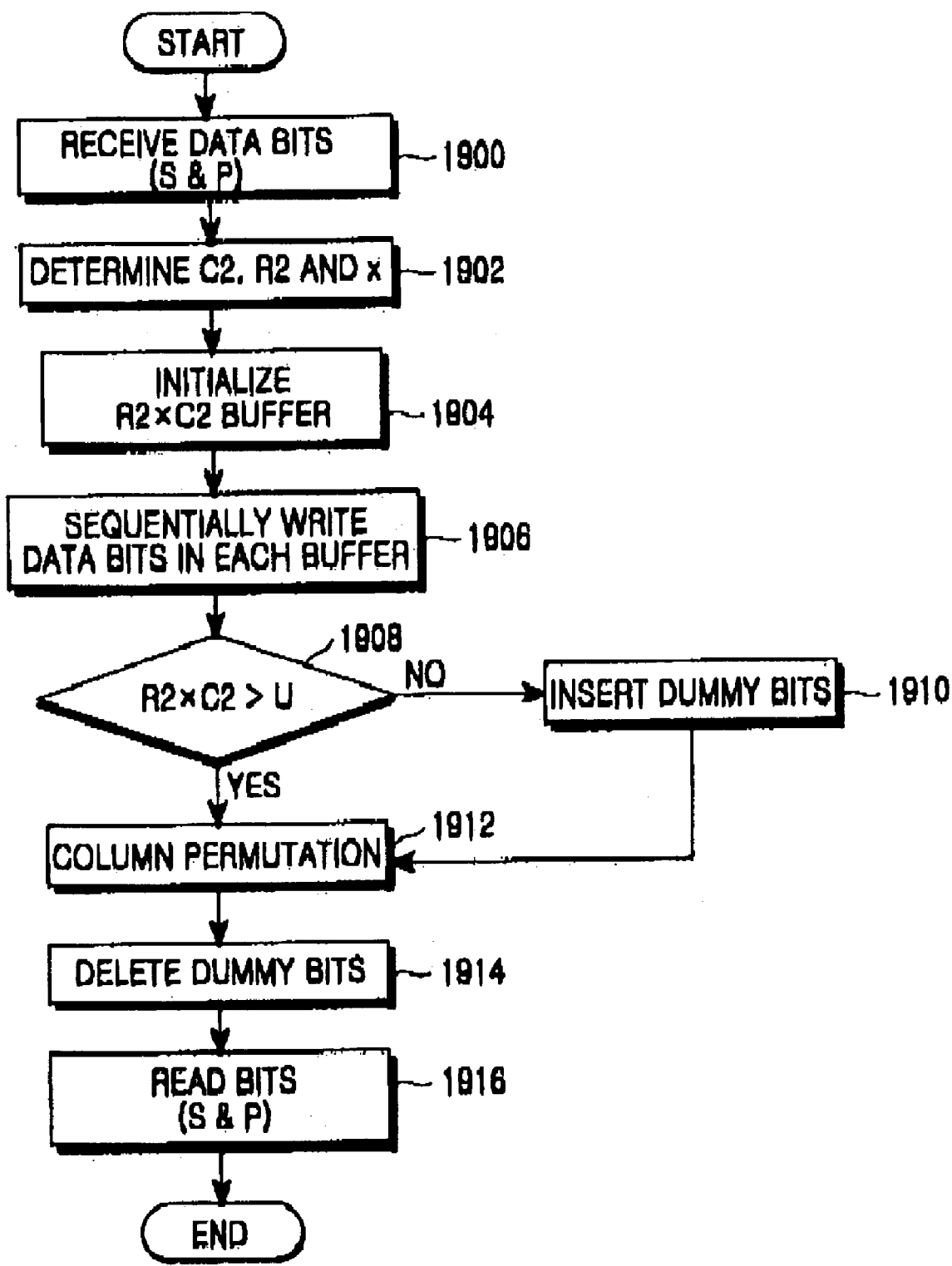
FIG. 19 is a flowchart illustrating an operation of the receiver according to an embodiment of the present invention.

FIG. 19 is a flowchart illustrating a deinterleaving process according to an embodiment of the present invention. The deinterleaving process is performed somewhat differently according to the interleaving processes performed by the interleaver in the transmitter. In order to finally create the original systematic bits and parity bits, the received bits are deinterleaved in a method corresponding to each method performed by the transmitter.

With reference to FIG. 19, a description will be made of an operation of the deinterleaver in the receiver according to an embodiment of the present invention. The deinterleaver receives $u_{p,1}, u_{p,2}, u_{p,3}, \ldots, u_{p,Us}$, and $u_{p,Us+1}, u_{p,Us+2}, u_{p,Us+3}, \ldots, u_{p,Us+Up}$ (Step 1900).

(1) First, the total number of columns C2 is set to 30. The columns are assigned column numbers 0, 1, 2, . . . , C2−1 from left to right. The minimum integer indicating a row of a matrix R2, satisfying a condition of U=Us+Up≦R2×C2, is determined (Step 1902). The rows of the matrix are assigned row numbers 0, 1, 2, . . . , R2−1 from top to bottom (Step 1904).

(2) The inputs $u_{p,1}, u_{p,2}, u_{p,3}, \ldots, u_{p,Us}$ are written in a forward direction row by row in an R2×C2 rectangular matrix beginning at $y_{p,1}$ in a $0^{th}$ row and a $0^{th}$ column, and the inputs $u_{p,Us+1}, u_{p,Us+2}, u_{p,Us+3}, \ldots, u_{p,Us+Up}$ are written in a reverse direction row by row beginning at a point in an $(R2-1)^{th}$ row and a $(x-1)^{th}$ column (Step 1906). Here, x means a remainder obtained by dividing the U by the C2, and is larger than or equal to 1 and smaller than C2 (1≦x<C2). If R2×C2>U (Step 1908), then dummy bits of $y_{p,k}=0$ or 1 (for k=U+1, U+2, . . . , R2×C2) are inserted (Step 1910). The dummy bits are deleted (Step 1914) after being subject to column permutation (Step 1912).

(3) After the column permutation is performed according to a rule (Step 1912), the resulting bits are divided into a systematic bit (S) part and a parity bit (P) part.

(4) Outputs of the deinterleaver are read by two bits column by column, by dividing the column-permuted R2×C2 matrix into a systematic bit part and a parity bit part (Step 1916).

As described above, the present invention provides a method for efficiently performing interleaving in mapping the bits with higher priority to the position with higher reliability of a symbol, thereby preventing an increase in hardware complexity and maintaining compatibility with an existing interleaving technique. Since the SMP technique for differentially mapping reliabilities according to priority shows theoretically sufficient effects, it is very important to realize the SMP technique. The present invention, when applied to a high-speed packet transmission system, especially HSDPA or 1×EV-DV system, can be realized through minor modification of an algorithm and minor addition of hardware, while maintaining its gain.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An apparatus for data transmission in a communication system, comprising:
   a turbo encoder for coding data bits to generate systematic bits and parity bits;
   a rate matcher for rate matching the systematic bits and parity bits;
   a first interleaver for writing the rate-matched systematic bits on a row by row basis, and performing inter-column permutation;
   a second interleaver for writing the rate-matched parity bits on a row-by-row basis, and performing inter-column permutation;
   a modulator for alternatively collecting the permutated bits on a column by column basis from the first interleaver and the second interleaver, and mapping collected bits from the first interleaver and second interleaver onto one modulation symbol,
   wherein a size of the first interleaver is equal to a size of the second interleaver.

2. The apparatus of claim 1, wherein if a number of the rate-matched systematic bits is less than a number of the rate-matched parity bits, part of the rate-matched parity bits is written next to the rate-matched systematic bits in the first interleaver.

3. The apparatus of claim 1, wherein if a number of the rate-matched systematic bits is greater than a number of the rate-matched parity bits, part of the rate-matched systematic bits is written prior to the rate-matched parity bits in the second interleaver.

4. The apparatus of claim 1, wherein if the modulation scheme is 16QAM (16-ary Quadrature Amplitude Modulation), alternatively outputting 2 bits on a column by column basis from the first interleaver and second interleaver.

5. The apparatus of claim 1, wherein if the modulation scheme is 16QAM (16-ary Quadrature Amplitude Modulation), mapping onto one modulation symbol 2 bits from the first interleaver and 2 bits from the second interleaver.

6. A method for data transmission in a communication system, comprising the steps of:
   turbo coding data bits to generate systematic bits and parity bits;
   rate matching the systematic bits and parity bits;
   writing the rate-matched systematic bits on a row by row basis in a first interleaver and the rate-matched parity bits on a row by row basis in a second interleaver;
   performing inter-column permutation in the first interleaver and in the second interleaver;
   alternatively collecting the permutated bits on a column by column basis from the first interleaver and the second interleaver;
   mapping the collected bits from the first interleaver and second interleaver onto one modulation symbol,
   wherein a size of the first interleaver is equal to a size of the second interleaver.

7. The method of claim 6, wherein if a number of the rate-matched systematic bits is less than a number of the rate-matched parity bits, part of the rate-matched parity bits is written next to the rate-matched systematic bits in the first interleaver.

8. The method of claim 6, wherein if a number of the rate-matched systematic bits is greater than a number of the rate-matched parity bits, part of the rate-matched systematic bits is written prior to the rate-matched parity bits in the second interleaver.

9. The method of claim 6, wherein if the modulation scheme is 16QAM (16-ary Quadrature Amplitude Modulation), alternatively outputting 2 bits on a column by column basis from the first interleaver and second interleaver.

10. The method of claim 6, wherein if the modulation scheme is 16QAM (16-ary Quadrature Amplitude Modulation), mapping onto one modulation symbol 2 bits from the first interleaver and 2 bits from the second interleaver.

11. An apparatus for receiving data in a communication system, comprising:
    a demodulator for demodulating a received symbol into a plurality of systematic bits and parity bits;
    a first deinterleaver for writing the plurality of systematic bits on a column by column basis and performing inter-column permutation;

a second deinterleaver for writing the plurality of parity bits on a column by column basis and performing inter-column permutation;

a rate matcher for rate matching the de-interleaved systematic bits and parity bits; and a decoder for decoding the rate matched systematic bits and parity bits, wherein a size of the first deinterleaver is equal to a size of the second deinterleaver.

12. The apparatus of claim 11, wherein if a number of the systematic bits is less than a number of the parity bits, part of the parity bits is written next to systematic bits in the first deinterleaver.

13. The apparatus of claim 11, wherein if a number of the systematic bits is greater than a number of the parity bits, part of the systematic bits is written prior to the parity bits in the second deinterleaver.

14. A method for receiving data in a communication system, comprising:

demodulating a received symbol into a plurality of systematic bits and parity bits;

writing the plurality of systematic bits on a column by column basis in a first deinterleaver and performing inter-column permutation, and writing the plurality of parity bits on a column by column basis in a second deinterleaver and performing inter-column permutation;

rate marching the de-interleaved systematic bits and parity bits; and decoding the rate matched systematic bits and parity bits, wherein a size of the first deinterleaver is equal to a size of the second deinterleaver.

15. The method of claim 14, wherein if a number of the systematic bits is less than a number of the parity bits, part of the parity bits is written next to the systematic bits in the first deinterleaver.

16. The method of claim 14, wherein if a number of the systematic bits is greater than a number of the parity bits, part of the systematic bits is written prior to the parity bits in the second deinterleaver.

* * * * *